(12) United States Patent
Sandhu et al.

(10) Patent No.: US 7,199,005 B2
(45) Date of Patent: Apr. 3, 2007

(54) METHODS OF FORMING PLURALITIES OF CAPACITORS

(75) Inventors: Gurtej S. Sandhu, Boise, ID (US); H. Montgomery Manning, Eagle, ID (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/196,593

(22) Filed: Aug. 2, 2005

(65) Prior Publication Data

US 2007/0032014 A1    Feb. 8, 2007

(51) Int. Cl.
*H01L 21/8242* (2006.01)
*H01L 21/20* (2006.01)

(52) U.S. Cl. ............ 438/244; 438/253; 438/387; 438/396

(58) Field of Classification Search ........... 438/244, 438/253, 387, 396, 255, 398, 243; 257/306, 257/308–311
See application file for complete search history.

(56) References Cited

U.S. PATENT DOCUMENTS

| | | | |
|---|---|---|---|
| 5,236,860 A | 8/1993 | Fazan et al. |
| 5,340,763 A | 8/1994 | Dennison |
| 5,401,681 A | 3/1995 | Dennison et al. |
| 5,498,562 A | 3/1996 | Dennison et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |

(Continued)

FOREIGN PATENT DOCUMENTS

| DE | 4447804 C2 | 1/2002 |
|---|---|---|
| WO | 2004/040252 | 12/2004 |

OTHER PUBLICATIONS

Gibson et al., *Cellular Solids*, MRS BULLETIN, pp. 270-274 (Apr. 2003).

(Continued)

*Primary Examiner*—Hsien-Ming Lee
(74) *Attorney, Agent, or Firm*—Wells St. John P.S.

(57) ABSTRACT

The invention comprises methods of forming pluralities of capacitors. In one implementation, metal is formed over individual capacitor storage node locations on a substrate. A patterned masking layer is formed over the metal. The patterned masking layer comprises openings therethrough to an outer surface of the metal. Individual of the openings are received over individual of the capacitor storage node locations. A pit is formed in the metal outer surface within individual of the openings. After forming the pits, the metal is anodically oxidized through the openings effective to form a single metal oxide-lined channel in individual of the openings over the individual capacitor storage nodes. Individual capacitor electrodes are formed within the channels in electrical connection with the individual capacitor storage node locations. At least some of the metal oxide is removed from the substrate, and the individual capacitor electrodes are incorporated into a plurality of capacitors. Other aspects and implementations are contemplated.

44 Claims, 26 Drawing Sheets

U.S. PATENT DOCUMENTS

| | | | |
|---|---|---|---|
| 5,821,140 | A | 10/1998 | Jost et al. |
| 5,900,660 | A | 5/1999 | Jost et al. |
| 5,955,758 | A | 9/1999 | Sandhu et al. |
| 5,981,350 | A | 11/1999 | Geusic et al. |
| 5,990,021 | A | 11/1999 | Prall et al. |
| 6,037,218 | A | 3/2000 | Dennison et al. |
| 6,110,774 | A | 8/2000 | Jost et al. |
| 6,133,620 | A | 10/2000 | Uochi |
| 6,180,450 | B1 | 1/2001 | Dennison |
| 6,204,143 | B1 | 3/2001 | Roberts et al. |
| 6,204,178 | B1 | 3/2001 | Marsh |
| 6,303,956 | B1 | 10/2001 | Sandhu et al. |
| 6,403,442 | B1 | 6/2002 | Reinberg |
| 6,432,472 | B1 | 8/2002 | Farrell et al. |
| 6,617,222 | B1 | 9/2003 | Coursey |
| 6,667,502 | B1 | 12/2003 | Agarwal et al. |
| 6,673,693 | B2 | 1/2004 | Kirchhoff |
| 6,709,978 | B2 | 3/2004 | Geusic et al. |
| 6,812,513 | B2 | 11/2004 | Geusic et al. |
| 6,927,122 | B2 | 8/2005 | Geusic et al. |
| 7,042,040 | B2 | 5/2006 | Horiguchi |
| 7,073,969 | B2 | 7/2006 | Kamm |
| 7,074,669 | B2 | 7/2006 | Iijima et al. |
| 7,081,384 | B2 | 7/2006 | Birner et al. |
| 7,084,451 | B2 | 8/2006 | Forbes et al. |
| 2001/0012223 | A1 | 8/2001 | Kohyama |
| 2001/0026974 | A1 | 10/2001 | Reinberg |
| 2002/0030221 | A1 | 3/2002 | Sandhu et al. |
| 2002/0039826 | A1 | 4/2002 | Reinberg |
| 2002/0086479 | A1 | 7/2002 | Reinberg |
| 2002/0090779 | A1 | 7/2002 | Jang |
| 2002/0098654 | A1 | 7/2002 | Durcan et al. |
| 2002/0153614 | A1 | 10/2002 | Ema et al. |
| 2002/0163026 | A1 | 11/2002 | Park |
| 2003/0153146 | A1 | 8/2003 | Won et al. |
| 2003/0178684 | A1 | 9/2003 | Nakamura |
| 2003/0190782 | A1 | 10/2003 | Ko et al. |
| 2003/0227044 | A1 | 12/2003 | Park |
| 2004/0056295 | A1 | 3/2004 | Argarwal |
| 2005/0051822 | A1 | 3/2005 | Manning |
| 2005/0054159 | A1 | 3/2005 | Manning et al. |
| 2006/0014344 | A1 | 1/2006 | Manning ............ 438/243 |

OTHER PUBLICATIONS

Kim, D.H. et al., "A Mechanically Enhanced Storage Node for Virtually Unlimited Height (MESH) Capacitor Aiming at Sub 70nm DRAMs", IEEE Jan. 2004, pp. 69-72.
John Banhart, *Aluminum Foams: On the road to Real Applications*, MRS BULLETIN, pp. 290-295 (Apr. 2003).
L. J. Gibson (Guest Editor), *Cellular Solids*, MRS BULLETIN, pp. 270-274 (Apr. 2003).
David J. Green et al., *Cellular Ceramics: Intriguing Structures, Novel Properties, and Innovative Applications*, MRS BULLETIN, pp. 296-300 (Apr. 2003).
PCT/US2004/027898; Filed: Aug. 26, 2004; PCT Search Report mailed Feb. 28, 2005; 4 pp.
"Novel Robust Cell Capacitor (Leaning Exterminated Ring Type Insulator) And New Storage Node Contact (Top Spacer Contact) For 70nm DRAM Technology And Beyond"; Park et al.; 2004 Symposium on VLSI Technology Digest of Technical Papers; Jul. 2004; pp. 34-35.
J. P. O'Sullivan et al., *The morphology and mechanism of formation of porous anodic films on aluminium*, Proc. Roy. Soc. Lond. A, vol. 317, pp. 511-543 (1970).
S. Shingubara, *Fabrication of nanomaterials using porous alumina templates*, J. Nanoparticle Res., vol. 5, pp. 17-30 (2003).
S. Tan et al., *High Aspect Ratio Microstructures on Porous Anodic Aluminum Oxide*, IEEE, pp. 267-272 (1995).
David J. Green et al., *The Structure and Applications of Cellular Ceramics*, 28 MRS BULLETIN, pp. 296-300, Apr. 2003).
Jeffrey M. Karp et al., *Scaffolds for Tissue Engineering*, MRS BULLETIN, pp. 301-302 (Apr. 2003).
Andrew M. Kraynik, *Foam Structure: From Soap Froth to Solid Foams*, MRS BULLETIN, pp. 275-278 (Apr. 2003).
U.S. Appl. No. 10/894,633, filed Jul. 19, 2004, Manning.
U.S. Appl. No. 10/928,931, filed Aug. 27, 2004, Busch et al.
U.S. Appl. No. 10/929,037, filed Aug. 27, 2004, Manning.
U.S. Appl. No. 11/006,331, filed Dec. 6, 2004, Basceri et al.
E. Maire et al., *In Situ X-Ray Tomography Measurements of Deformation in Cellular Solids*, MRS BULLETIN, pp. 284-289 (Apr. 2003).
Guy Hwan Oh et al., *Preparation and Pore-Characteristics Control of Nano-Porous Materials Using Organo-metallic Building Blocks*, 4 Carbon Science, No. 1, pp. 1-9 (Mar. 2003).
P. R. Onck, *Scale Effects in Cellular Metals*, MRS BULLETIN, pp. 279-283 (Apr. 2003).
Miri Park et al., *Block Copolymer Lithography: Periodic Arrays of—10" Holes in 1 Square Centimeter*, 276 SCIENCE, pp. 1401-1404 (May 30, 1997).
Masuhiro Tsukada et al., *Preparation and Application of Porous Silk Fibroin Materials*, 54 Journal of Applied Polymer Science, pp. 507-514 (1994).
J. Liang et al., *Nonlithographic Fabrication of Lateral Superlattices for Nanometric Electromagnetic-Optic . . .* IEEE J. Selected Topics in Quantum Electr., vol. 8, No. 5, pp. 998-1008 (Sep./Oct. 2002).
V. V. Konovalov et al., *Chemistry of Materials*, Chem. Mater., vol. 11, No. 8, pp. 1949-1951 (Aug. 1999).
H. Masuda et al., *Highly ordered nanochannel-array architecture in anodic alumina*, App. Phys. Lett, vol. 71, No. 19, pp. 2770-2772 (Nov. 1997).
D. Crouse et al., *Self-Assembled Nanostructures Using Anodized Alumina Thin Films for Optoelectronic Applications*, IEEE, pp. 234-235 (1999).
A. Nadeem et al., *Fabrication of Microstructures Using Aluminum Anodization Techniques*, pp. 274-277 (pre-2004).
C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).
U.S. Appl. No. 11/083,489, filed Mar. 2005, Sandhu et al.
U.S. Appl. No. 11/131,552, filed May 2005, Manning.
U.S. Appl. No. 11/131,575, filed May 2005, Manning et al.
U.S. Appl. No. 11/360,540, filed Feb. 23, 2006, Rana (as filed).
U.S. Appl. No. 11/580,418, filed Oct. 11, 2006, Raghu et al. (as filed).
Li, X. and Bohn, P.W., "Metal-assisted chemical etching in $HF/H_2O_2$ produces porous silicon", Applied Physics Letters, vol. 77, No. 16, Oct. 16, 2000, pp. 2572-2574.

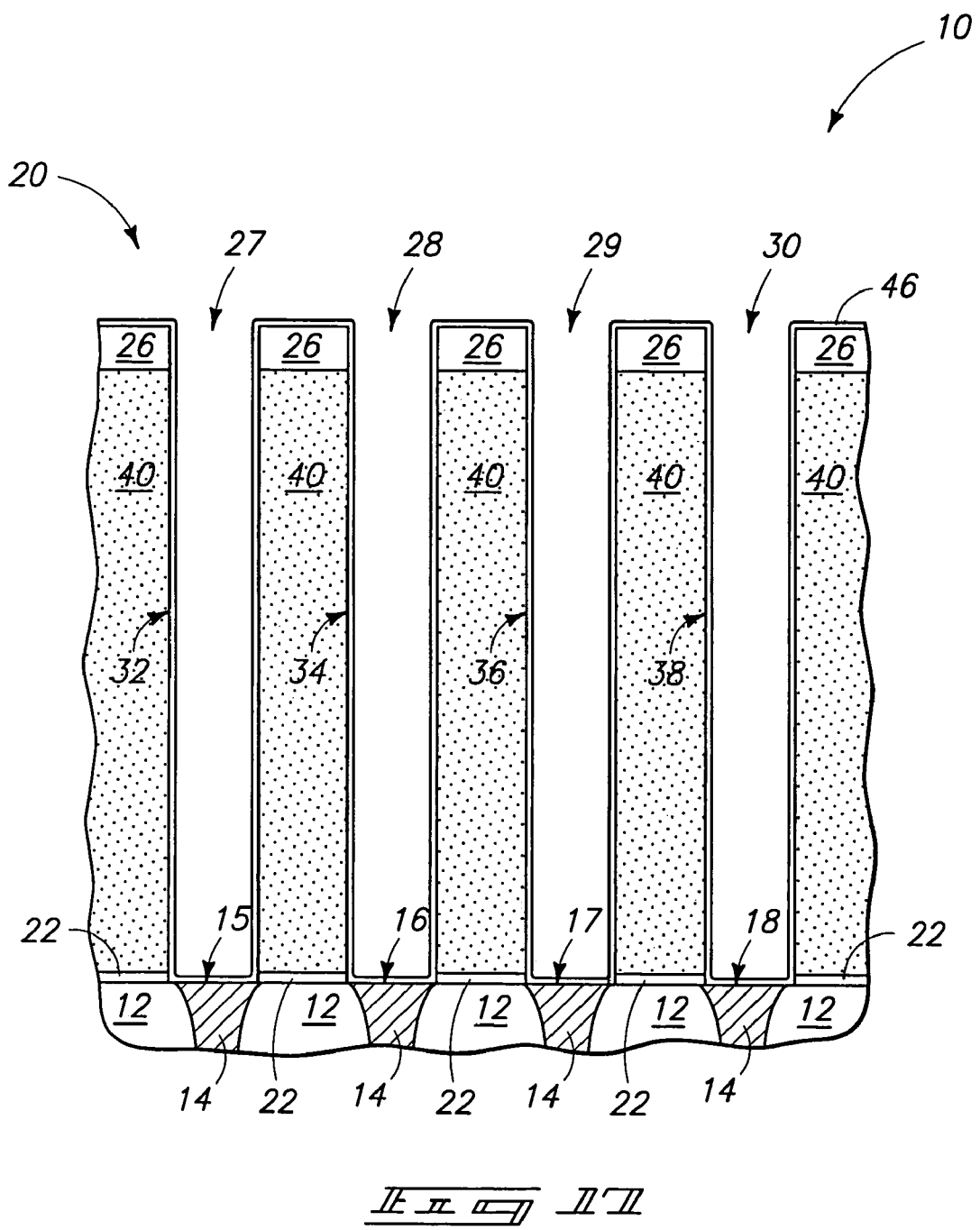
F I G 17

METHODS OF FORMING PLURALITIES OF CAPACITORS

TECHNICAL FIELD

This invention relates to methods of forming pluralities of capacitors.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area, and thereby increased capacitance for the capacitors being formed. However, the capacitor electrodes formed in deep openings are typically correspondingly much taller than they are wide. This can lead to toppling of the capacitor electrodes either during the etch to expose the outer sidewall surfaces, during transport of the substrate, and/or during deposition of the capacitor dielectric layer or outer capacitor electrode layer. Our U.S. Pat. No. 6,667,502 teaches provision of a brace or retaining structure intended to alleviate such toppling.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming pluralities of capacitors. In one implementation, metal is formed over individual capacitor storage node locations on a substrate. A patterned masking layer is formed over the metal. The patterned masking layer comprises openings therethrough to an outer surface of the metal. Individual of the openings are received over individual of the capacitor storage node locations. A pit is formed in the metal outer surface within individual of the openings. After forming the pits, the metal is anodically oxidized through the openings effective to form a single metal oxide-lined channel in individual of the openings over the individual capacitor storage nodes. Individual capacitor electrodes are formed within the channels in electrical connection with the individual capacitor storage node locations. At least some of the metal oxide is removed from the substrate, and the individual capacitor electrodes are incorporated into a plurality of capacitors.

Other aspects and implementations are contemplated.

BRIEF DESCRIPTION OF THE DRAWINGS

Preferred embodiments of the invention are described below with reference to the following accompanying drawings.

FIG. 17 is a view of the FIG. 16 substrate at a processing step subsequent to that shown by FIG. 16.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
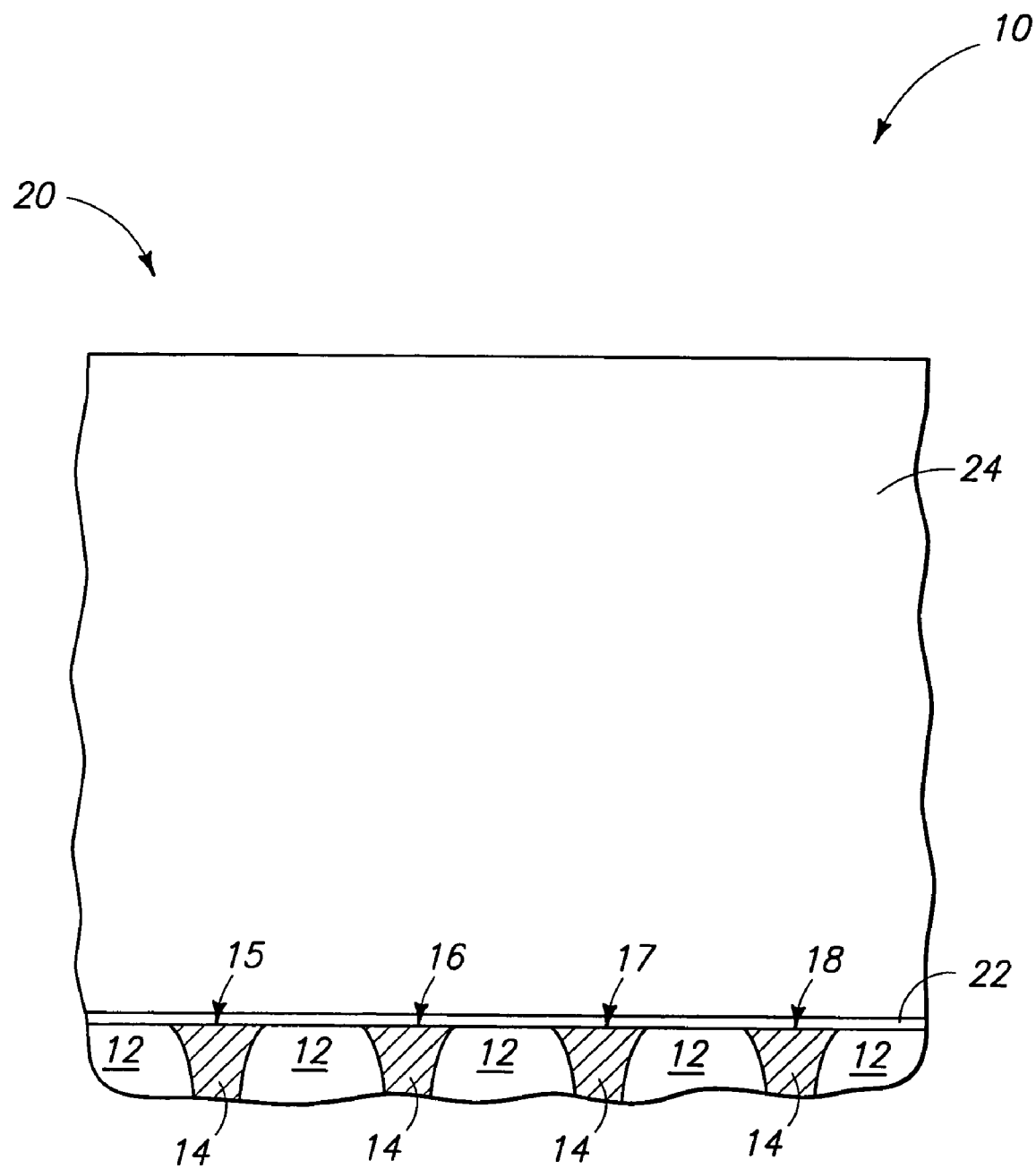
FIG. 1 is a diagrammatic cross section of a substrate fragment in process in accordance with an aspect of the invention.

Exemplary preferred methods of forming a plurality of capacitors are described with reference to FIGS. 1–26. FIG. 1 depicts a substrate 10 preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly and by way of example only, FIG. 1 might comprise a bulk semiconductor material (not shown), for example bulk monocrystalline silicon and/or alternately comprise semiconductor-on-insulator layers.

FIG. 1 depicts an insulative material 12 having electrically conductive storage node pillars 14 formed therethrough. Materials 12 and 14 would typically be fabricated over some suitable underlying material, for example bulk monocrystalline silicon and/or other underlying circuitry. An exemplary insulative material 12 includes doped and undoped silicon dioxides, for example silicon dioxide deposited by decomposition of tetraethyl orthosilicate (TEOS) and/or borophosphosilicate glass (BPSG) and/or silicon nitride. Alternately by way of example only, material 12 might comprise anisotropically etched insulative spacers, for example formed about transistor gate lines. An exemplary preferred conductive material 14 is conductively doped polysilicon. Conductive material 14 can be considered as comprising or defining a plurality of capacitor storage node locations 15, 16, 17 and 18 on substrate 10. FIG. 1 can also be considered as depicting a capacitor array area 20 over substrate 10 within which a plurality of capacitors will be formed, in accordance with one preferred embodiment. Storage node locations 15, 16, 17 and 18 are exemplary only, and regardless may be conductive at this point in the process or made conductive subsequently.

An optional layer 22 has been formed over material 12 and capacitor storage node locations 15, 16, 17 and 18. An exemplary preferred material for layer 22 comprises silicon nitride deposited to an exemplary thickness range of from 100 Angstroms to 2,000 Angstroms. Layer 22 might optionally be included to provide an etch stop, or other, function. A material 24 is formed over individual capacitor storage node locations 15, 16, 17 and 18, and in the depicted exemplary embodiment, over layer 22. Layer 24 will be anodically oxidized as described below, and preferably comprises metal. In the context of this document, "metal" refers to metal in elemental form, or an alloy of elemental metals. An exemplary preferred thickness range for preferred metal 24 is from 1 micron to 10 microns, with 2 microns being a specific preferred example. Thinner thicknesses are of course contemplated. One exemplary preferred metal comprises aluminum. Other exemplary preferred metals comprise at least one of Ti, Ta, Nb, Zr, W, V, Hf, Si, B and Bi. Such metals might, of course, be alloyed with any one or combination of the other, including any one or combination being alloyed with elemental aluminum. Preferably, metal 24 is very pure (in excess of 99.99 percent metal), and can be polished to provide a smooth outer surface.

Figure 2:
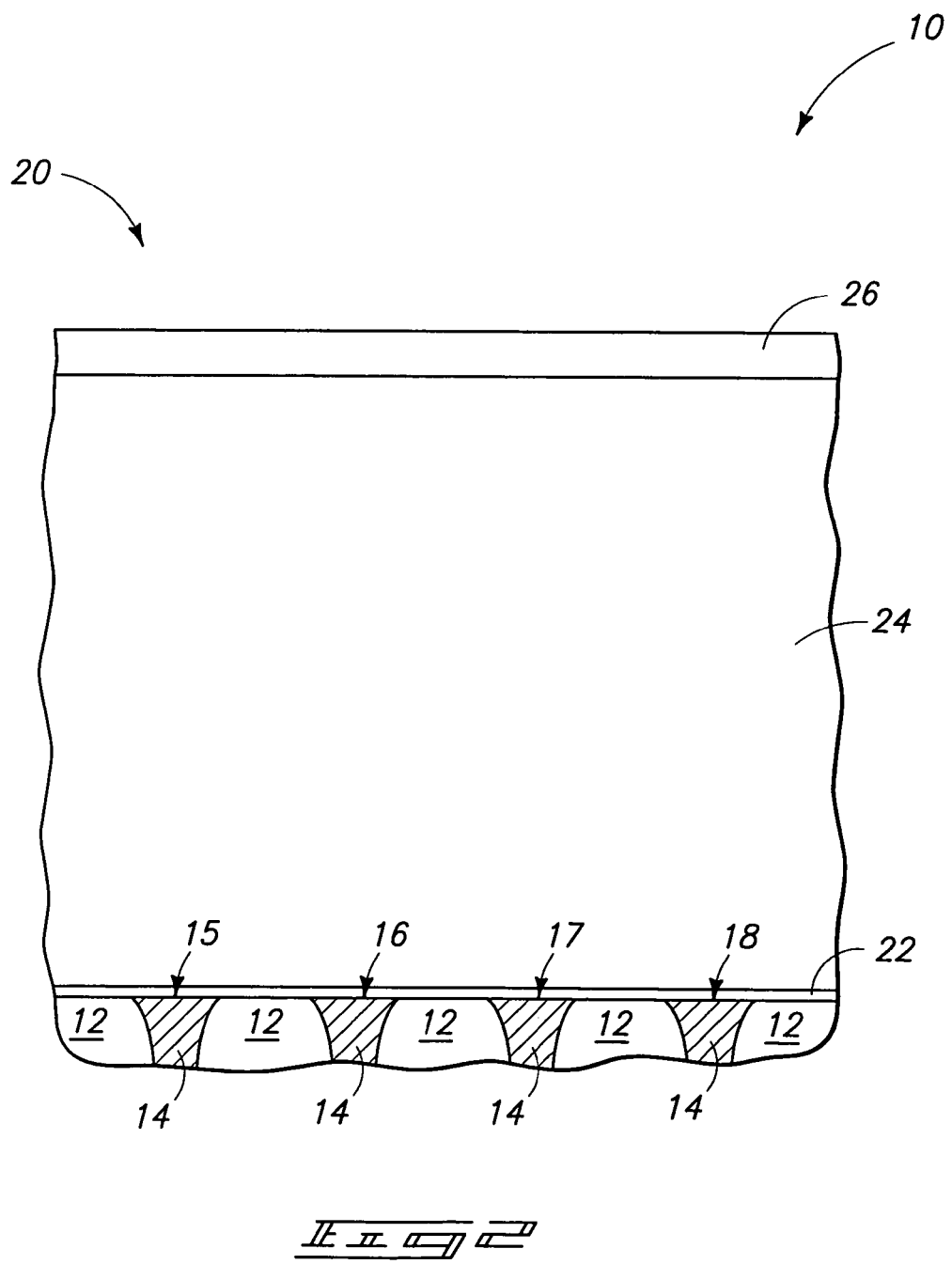
FIG. 2 is a view of the FIG. 1 substrate at a processing step subsequent to that shown by FIG. 1.

Referring to FIG. 2, a masking layer 26 has been deposited over preferred metal 24. Masking layer 26 might be any of electrically conductive, semiconductive or electrically insulative material, or combinations thereof. By way of example only, an exemplary preferred material 26 includes silicon nitride. Some or all of layer 26 might be removed, or some or all of layer 26 might remain over the substrate as part of finished circuitry construction incorporating the plurality of capacitors being fabricated. An exemplary preferred thickness for masking layer 26 is from 100 Angstroms to 5,000 Angstroms.

Figure 3:
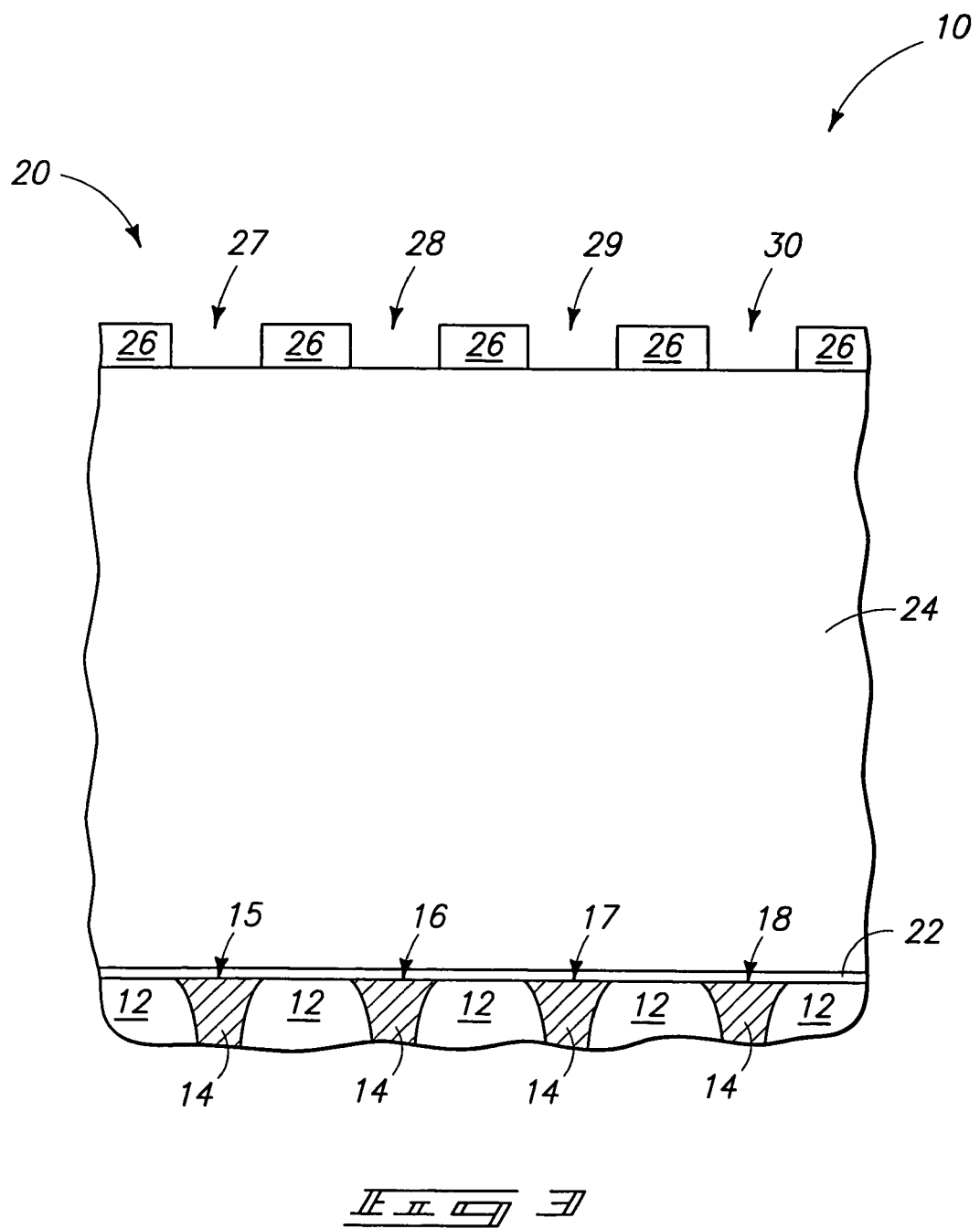
FIG. 3 is a view of the FIG. 2 substrate at a processing step subsequent to that shown by FIG. 2.
Figure 4:
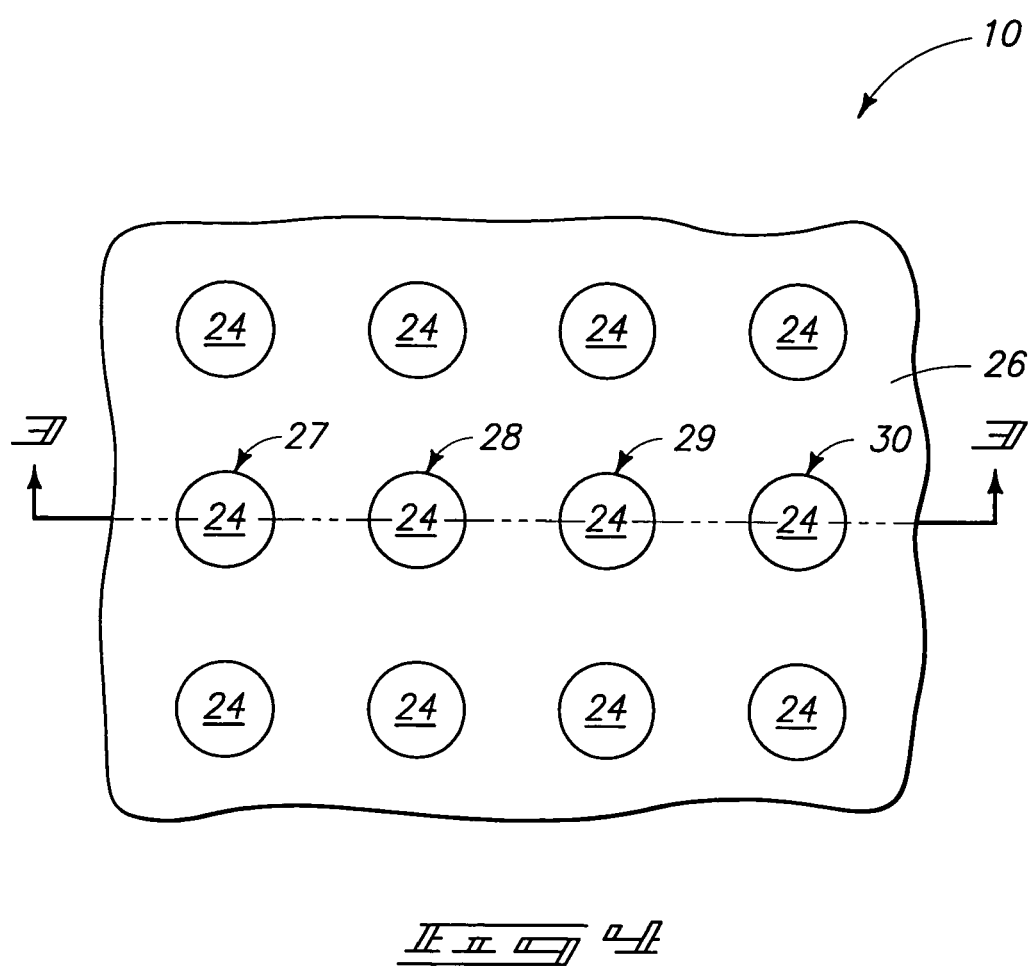
FIG. 4 is a diagrammatic top plan view of the FIG. 3 substrate.

Referring to FIGS. 3 and 4, masking layer 26 has been patterned over metal 24 effective to form openings 27, 28, 29 and 30 to metal 24. Additional corresponding openings are shown in FIG. 4. Individual of such openings 27, 28, 29 and 30 are received over individual of capacitor storage node locations 15, 16, 17 and 18, respectively. A preferred manner of forming openings 27, 28, 29 and 30 is by lithography and etch, for example and by way of example only, utilizing photolithography with an overlying masking layer such as photoresist (not shown). Such openings can be of any desired shape or shapes, for example any of circular, oval, elliptical, square, rectangular, etc.

The above-described processing is but only one example of forming a patterned masking layer over a material to be anodically oxidized, such as metal, wherein the patterned masking layer comprises openings therethrough, and whereby individual of such openings are received over individual of the capacitor storage node locations. Of course, any other manner of forming such an exemplary patterned masking layer is also contemplated, and whether existing or yet-to-be developed.

Figure 5:
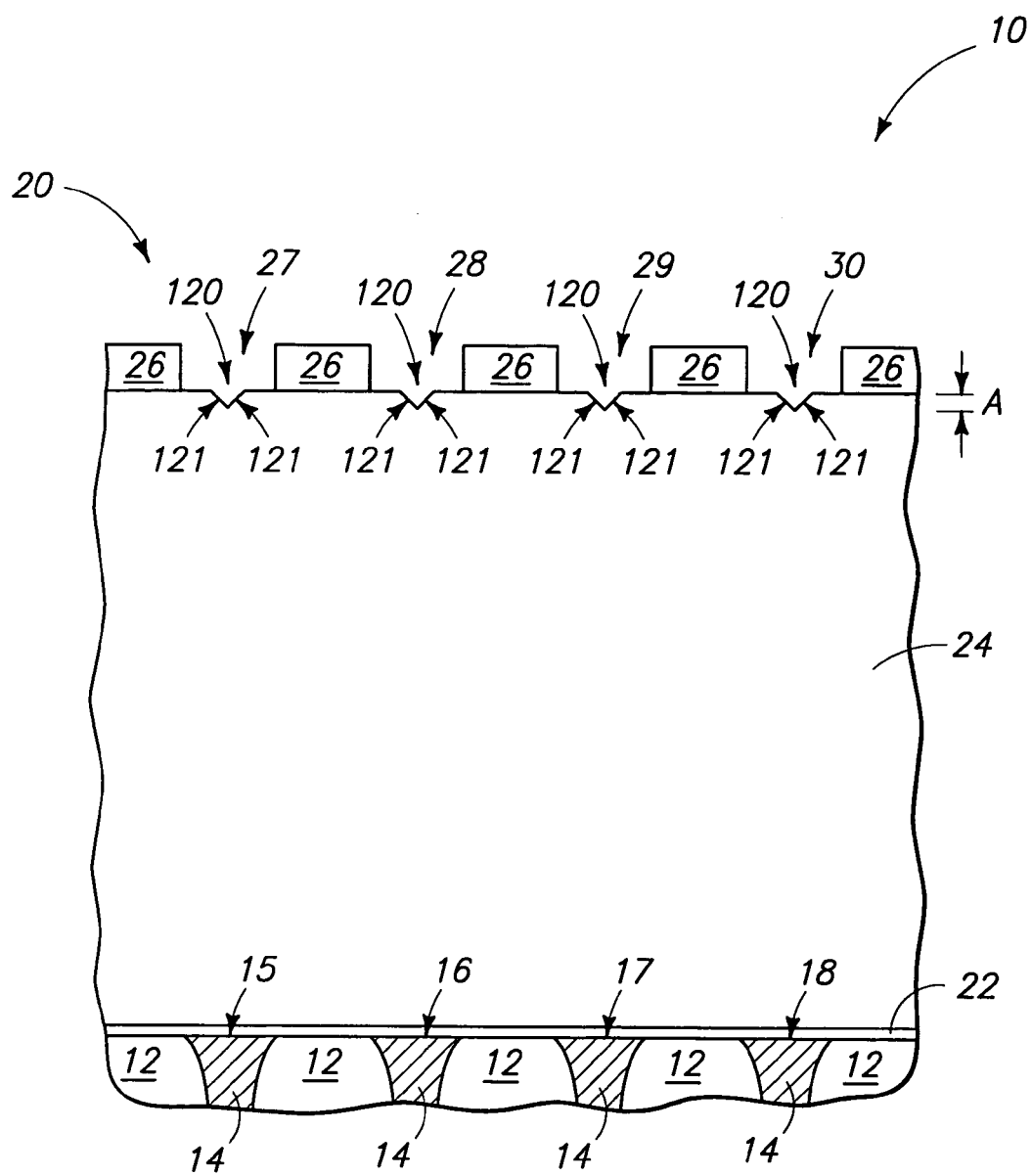
FIG. 5 is a view of the FIG. 3 substrate at a processing step subsequent to that shown by FIG. 3.

Referring to FIG. 5, a pit 120 has been formed in an outer surface of metal 24 within or exposed through individual of openings 27, 28, 29 and 30. FIG. 5 depicts no more than a single pit 120 being formed per individual opening 27, 28, 29 and 30, although two or more pits might be formed per opening. Pits 120 might be formed by any suitable or yet-to-be developed method, for example by etching or by sputtering (with or without angled ion bombardment), or by the mechanical imprinting of metal 24 with an imprint template. In one exemplary embodiment, individual pits 120 have a depth "A" of at least 20 Angstroms in metal 24, and even more preferably have a depth "A" of at least 30 Angstroms in metal 24.

Figure 6:
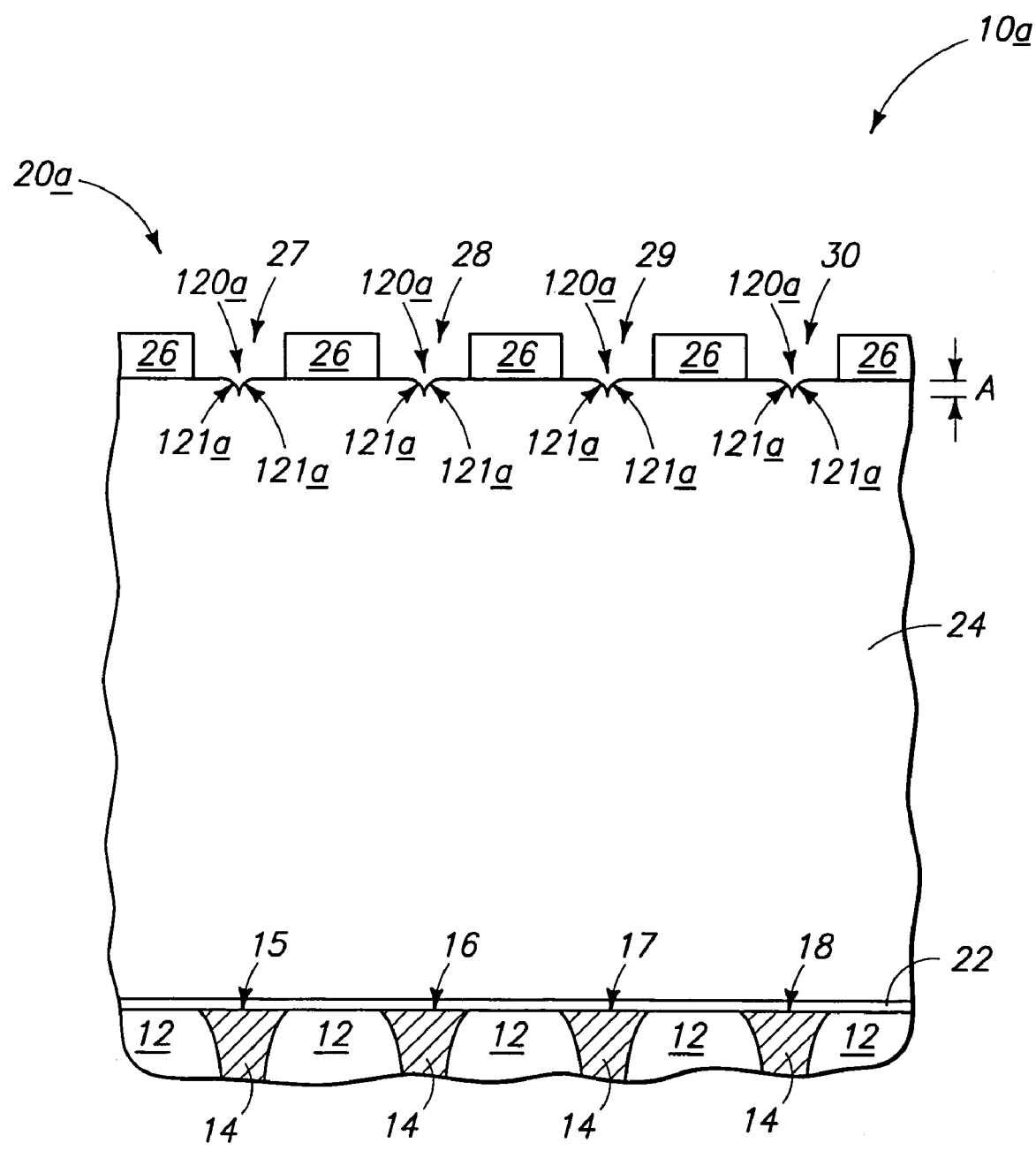
FIG. 6 is a diagrammatic cross section of an alternate substrate fragment in process in accordance with an aspect of the invention.

FIG. 5 depicts individual pits 120 as being "v" shaped, and as having straight sidewalls 121. FIG. 6 depicts an alternate exemplary substrate fragment 10a, where like numerals form the first-described embodiment are utilized where appropriate, with differences being indicated with the suffix "a". Substrate fragment 10a also comprises v-shaped individual pits 120a, but having exemplary convexly curved sidewalls 121a.

Figure 7:
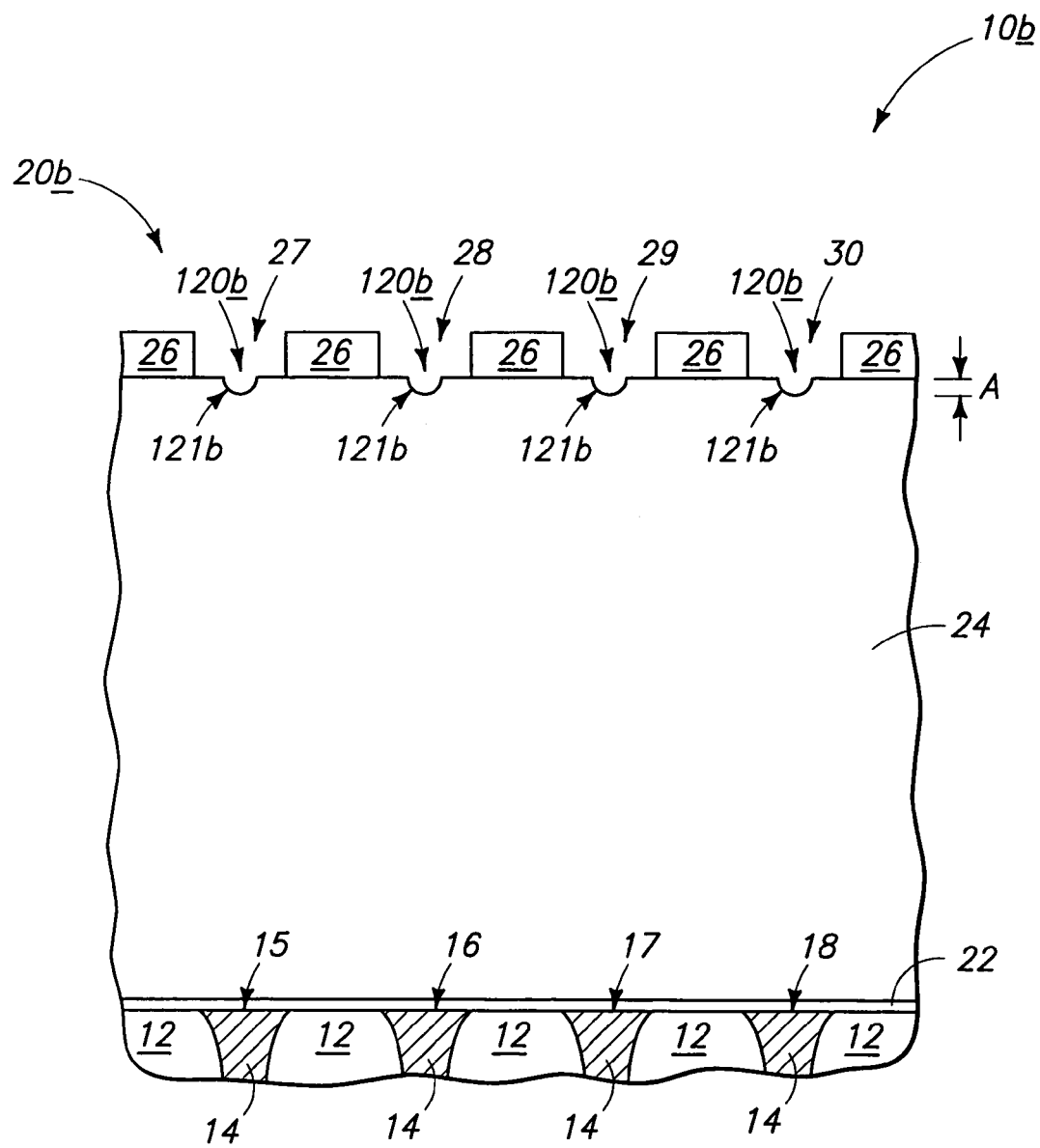
FIG. 7 is a diagrammatic cross section of an alternate substrate fragment in process in accordance with an aspect of the invention.

Alternate configurations are contemplated, of course. For example, FIG. 7 depicts an alternate embodiment substrate fragment 10b. Like numerals from the first-described embodiment have been utilized where appropriate, with differences being indicated with the suffix "b". FIG. 7 depicts individual pits 120b as being generally "u" shaped.

Figure 8:
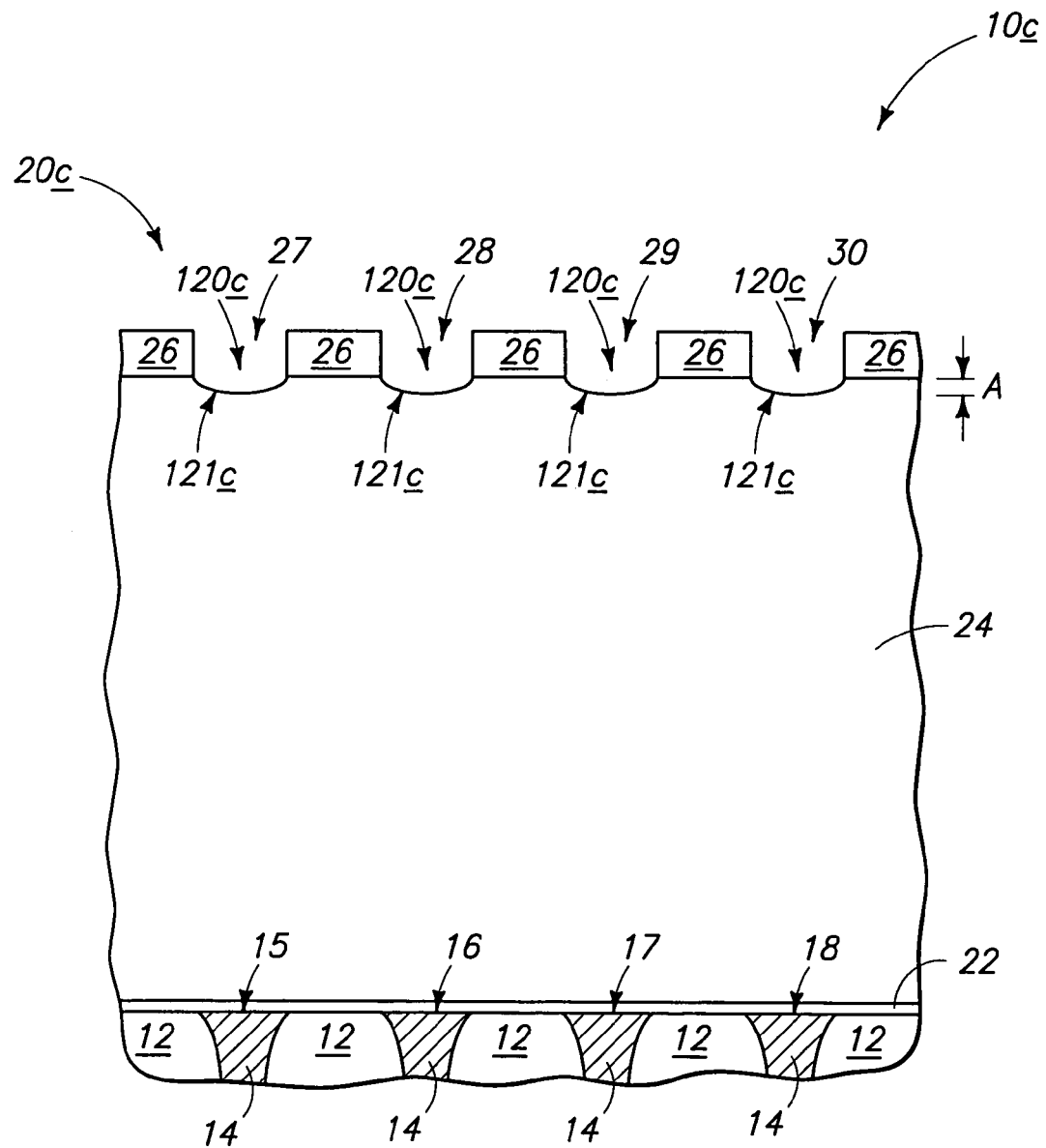
FIG. 8 is a diagrammatic cross section of an alternate substrate fragment in process in accordance with an aspect of the invention.

The exemplary FIGS. 5–7 embodiments depict individual pits 120/120a/120b as being centered between sidewalls which define individual openings 27, 28, 29 and 30 in patterned masking layer 26. Alternately by way of example only, an individual pit might span entirely between sidewalls which define the individual openings in the patterned masking layer, for example as depicted with respect to a substrate fragment 10c in FIG. 8. Like numerals from the first-described embodiment have been utilized where appropriate, with differences being indicated with the suffix "c". FIG. 8 depicts pits 120c, with other shapes of course being contemplated, for example full-spanning v-shaped and other shaped pits.

Figure 9:
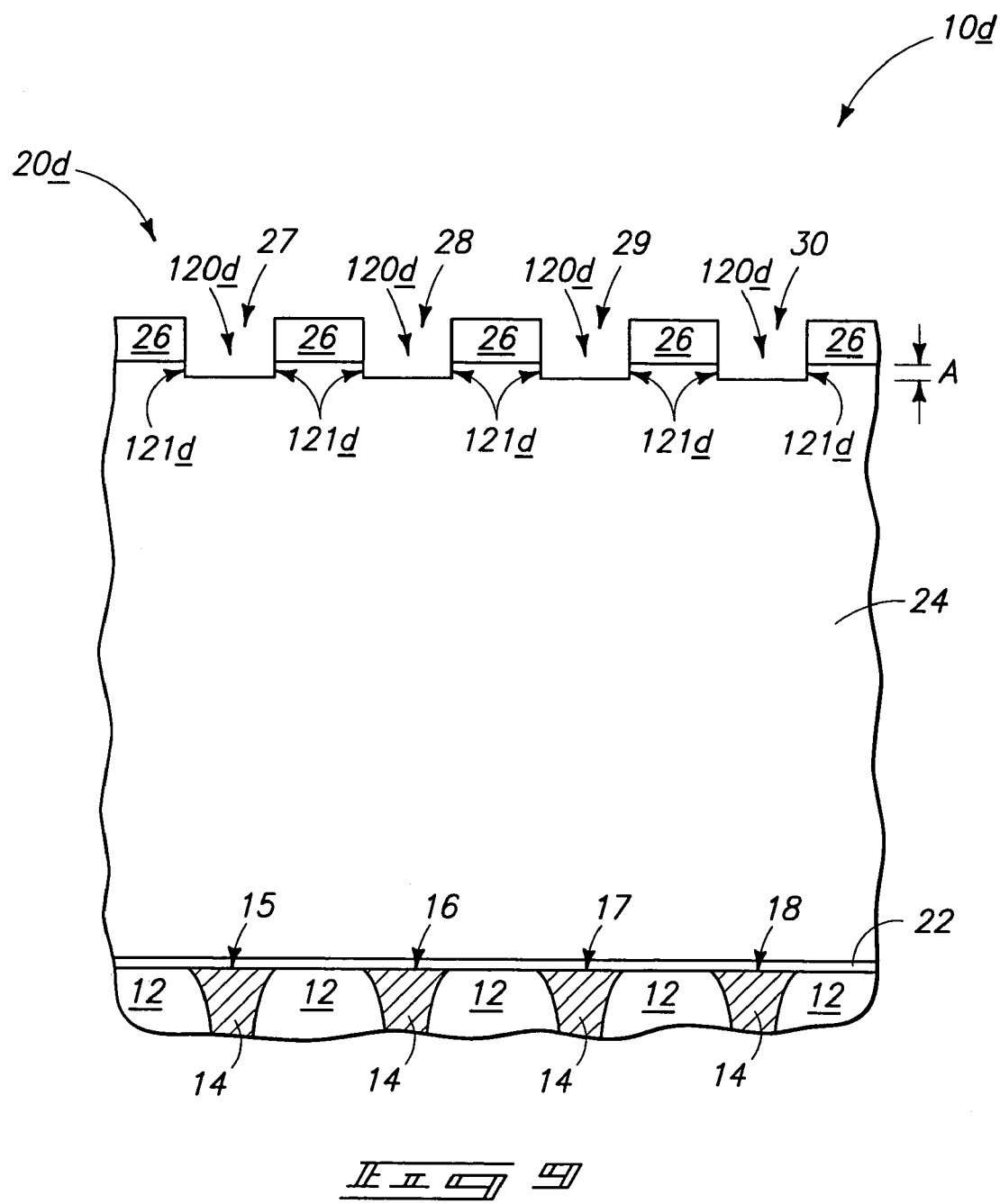
FIG. 9 is a diagrammatic cross section of an alternate substrate fragment in process in accordance with an aspect of the invention.

For example, FIG. 9 depicts an alternate embodiment substrate fragment 10d. Like numerals from the first-described embodiment are utilized where appropriate, with differences being indicated with the suffix "d". Substrate fragment 10d is similar to the FIG. 7 embodiment wherein pits 120d have a general "u" shape, however, wherein sidewalls 121d are essentially straight-vertical, and extend to a flat base.

Figure 10:
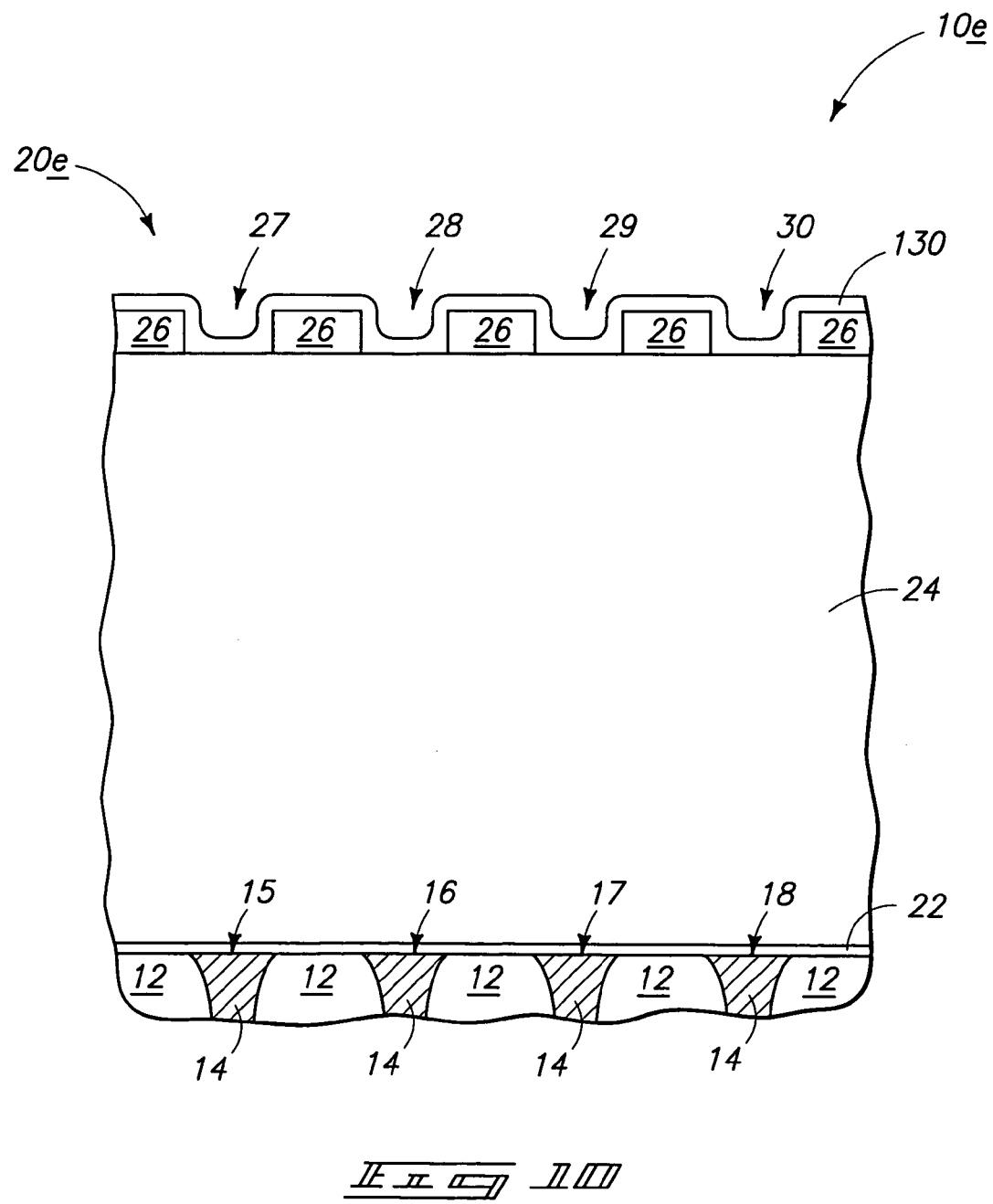
FIG. 10 is a diagrammatic cross section of an alternate substrate fragment in process in accordance with an aspect of the invention.

By way of example only, yet another alternate exemplary implementation in accordance with an aspect of the invention is depicted with respect to a wafer fragment 10e in FIGS. 10–13. Like numerals from the first-described embodiment are utilized where appropriate, with differences being indicated with the suffix "e" or with different numerals. FIG. 10 depicts the deposition of a layer 130 to less than fill openings 27, 28, 29 and 30 within masking layer 26. Such layer may be electrically insulative, electrically conductive, and/or semiconductive. Silicon nitride, titanium nitride and polysilicon are but a few examples.

Figure 11:
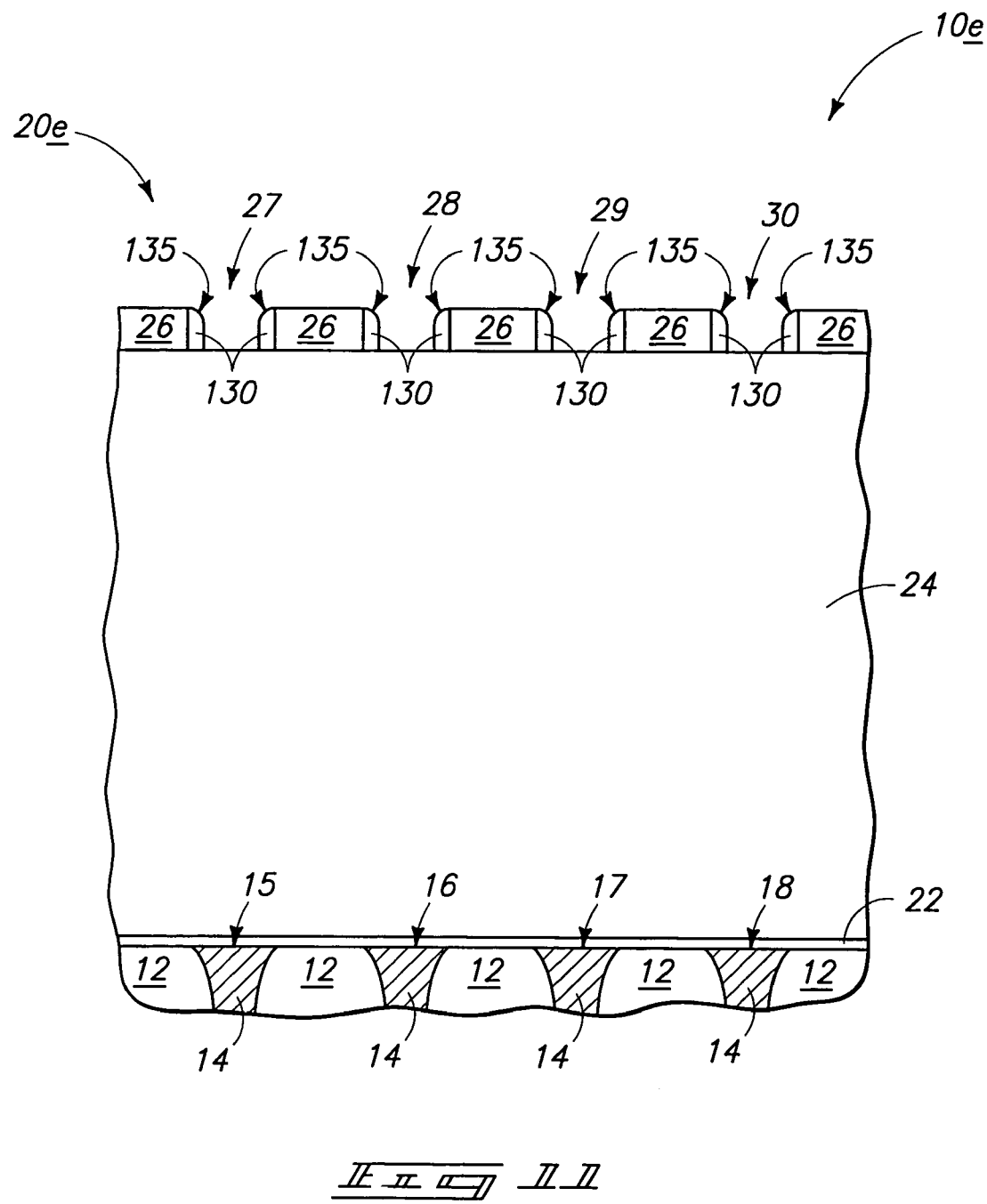
FIG. 11 is a view of the FIG. 10 substrate at a processing step subsequent to that shown by FIG. 10.

Referring to FIG. 11, layer 130 has been anisotropically etched to form anisotropically etched sidewall spacers 135 over the opposing sidewalls of individual masking layer openings 27, 28, 29 and 30.

Figure 12:
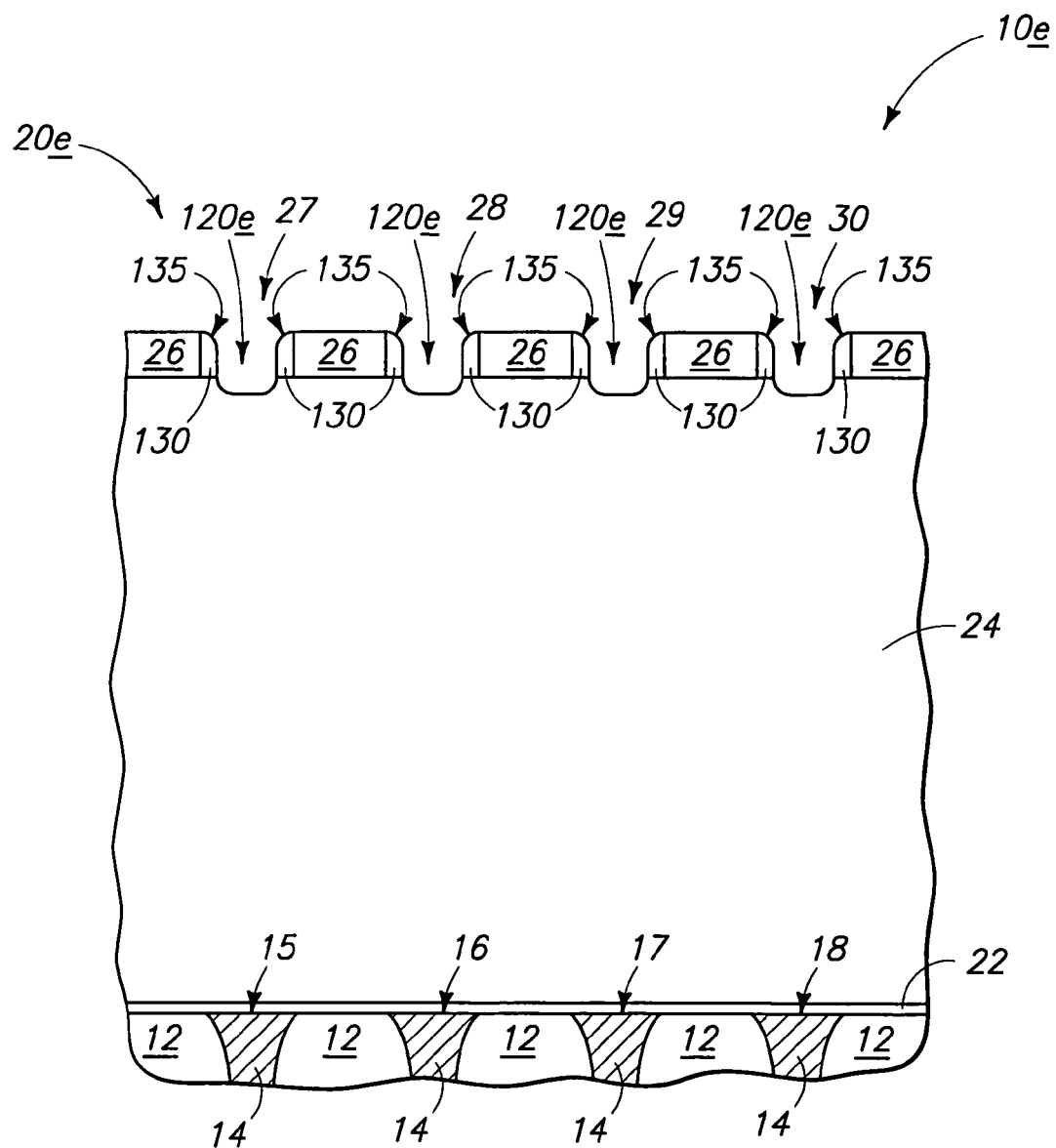
FIG. 12 is a view of the FIG. 11 substrate at a processing step subsequent to that shown by FIG. 11.

Referring to FIG. 12, metal 24 has been recessed within individual openings 27, 28, 29 and 30 intermediate sidewall spacers 135, forming pits 120e. Such recessing preferably comprises etching, although other techniques are also contemplated, such as physical sputtering action or imprinting, by way of example only.

Figure 13:
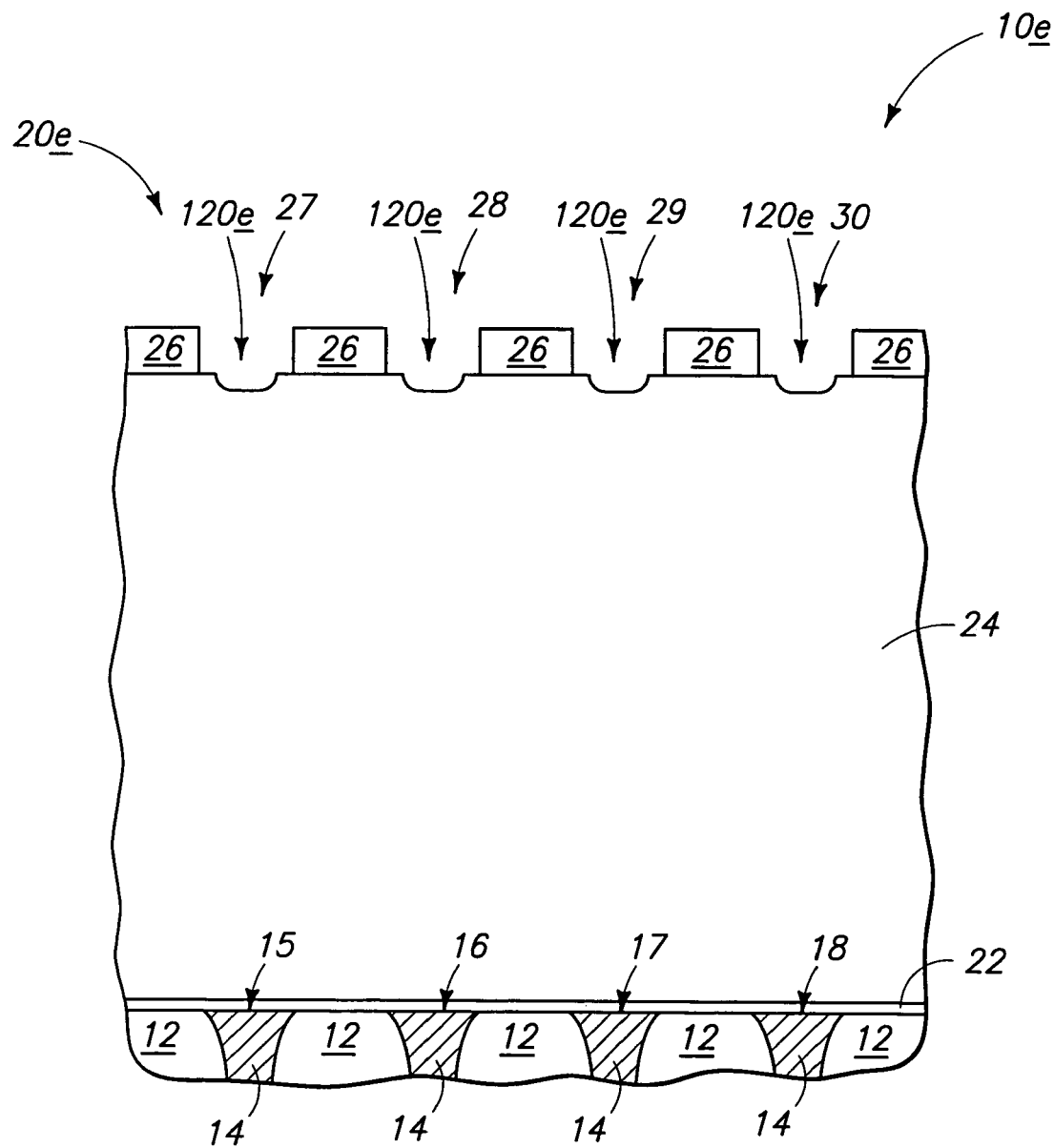
FIG. 13 is a view of the FIG. 12 substrate at a processing step subsequent to that shown by FIG. 12.

Referring to FIG. 13, spacers 135 (not shown) have been removed. Such preferably occurs by any suitable chemical etching.

Figure 14:
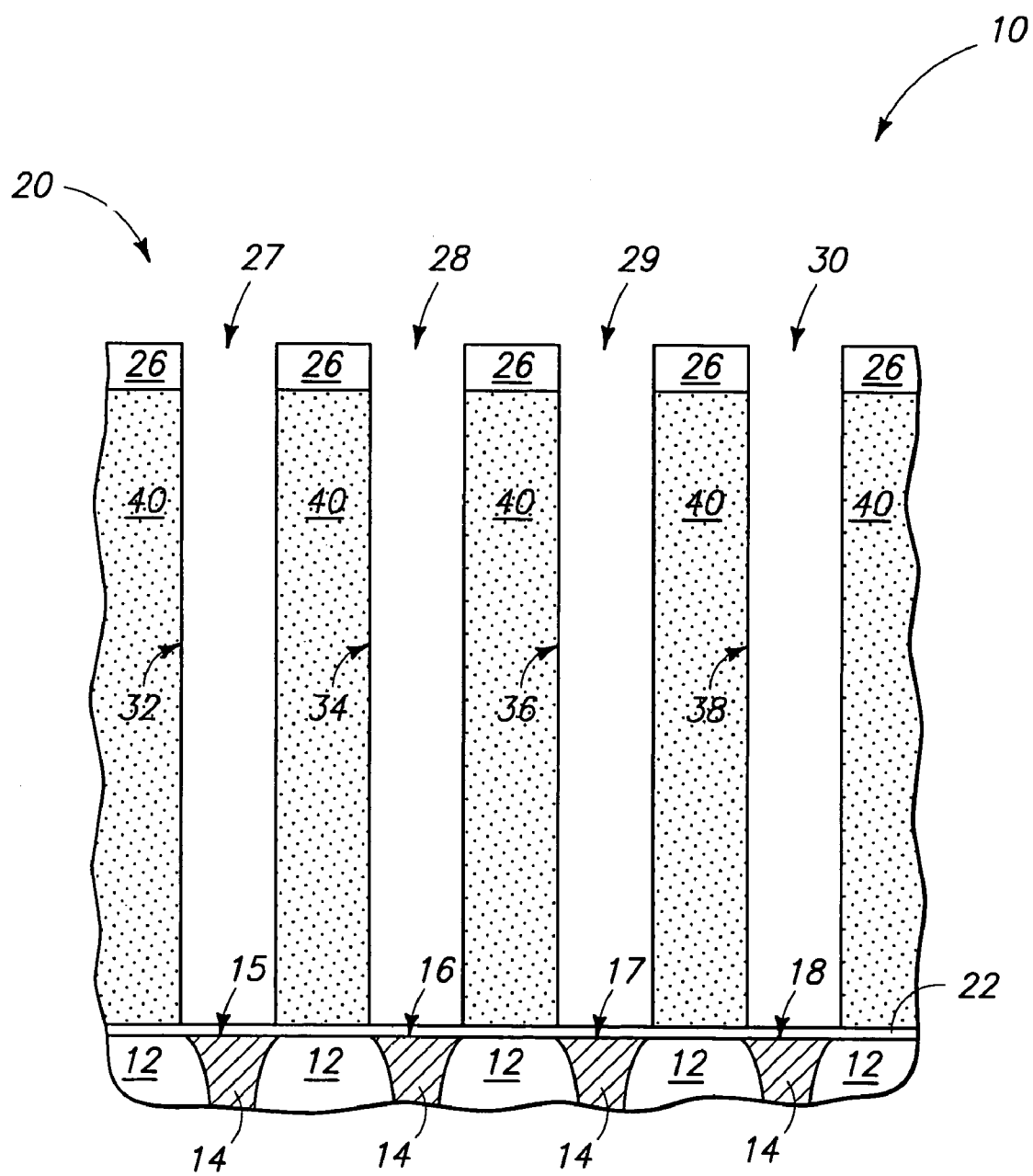
FIG. 14 is a view of the FIG. 5 substrate at a processing step subsequent to that shown by FIG. 5.
Figure 15:
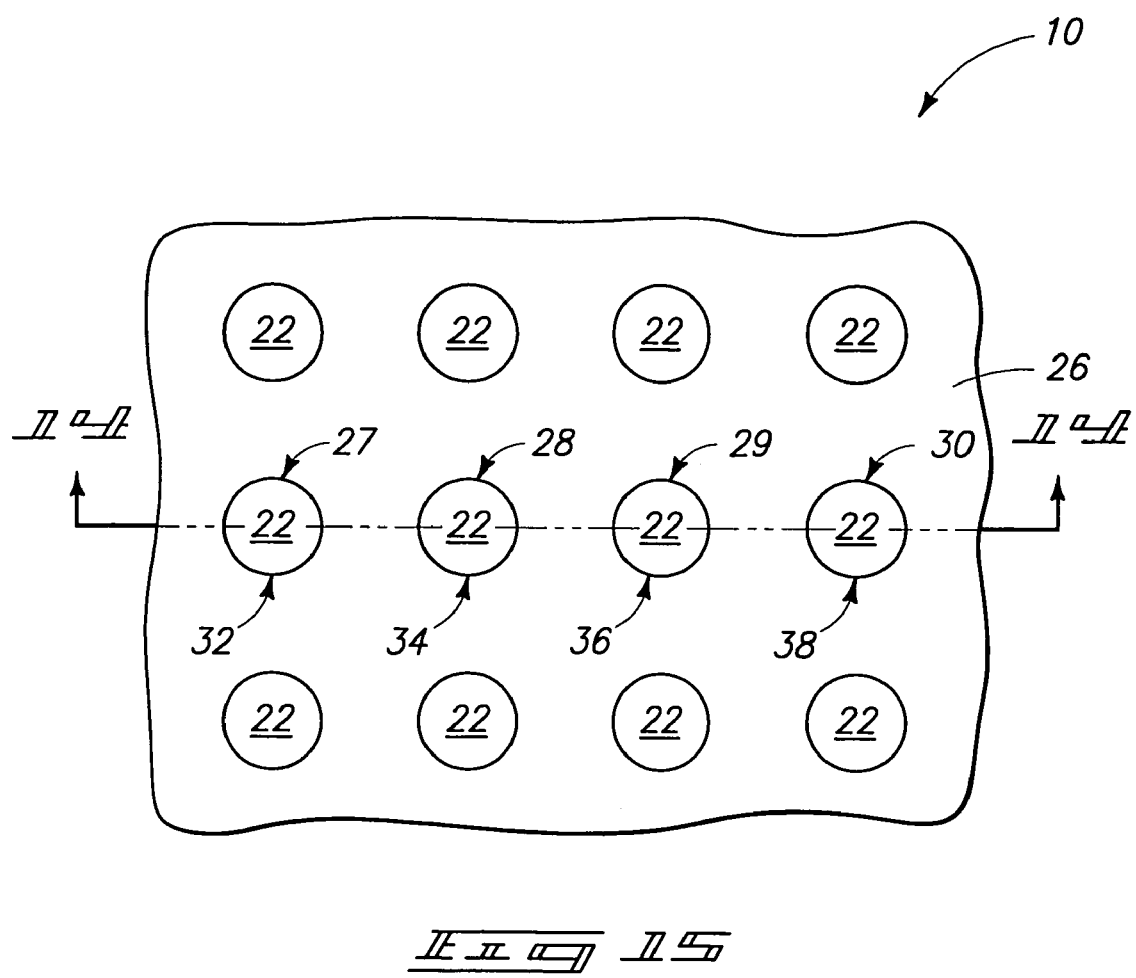
FIG. 15 is a diagrammatic top plan view of the FIG. 14 substrate.

Referring to FIGS. 14 and 15, material 24 (not shown) of substrate 10 has been anodically oxidized/etched through openings 27, 28, 29 and 30 effective to form a single metal oxide-lined channel 32, 34, 36 and 38 in individual of openings 27, 28, 29 and 30, respectively, over individual capacitor storage nodes 15, 16, 17 and 18, respectively. The anodic oxidizing might oxidize all of such metal into metal oxide material 40 (as shown). Alternately by way of example only, such anodic oxidizing might not oxidize all of the metal to metal oxide. For example and by way of example only, the anodic oxidizing might only oxidize an elevationally upper or outermost portion of material 24 of FIG. 5, or not all of material 24 received laterally between openings 32, 34, 36 and 38 independent of elevation. FIGS. 14 and 15 depict an exemplary preferred embodiment wherein the anodic oxidizing forms the channels to extend completely to optional layer 22, and also wherein such oxidizing does not form channels 32, 34, 36 and 38 to extend to or expose individual capacitor storage node locations 15, 16, 17 and 18 at this point in the process. Alternately, for example if layer 22 were not present, exemplary preferred anodic oxidizing might form the channels to extend to and expose the individual capacitor storage locations. Further alternately, and by way of example only were a layer 22 not utilized, the invention also contemplates anodic oxidizing wherein channels 32, 34, 36 and 38 do not necessarily extend completely to the individual capacitor storage node locations at this point in the process. A subsequent etch could be conducted to expose such locations prior to forming individual capacitor electrodes, for example as is described subsequently. Where, for example, a preferred metal 42 comprises aluminum, the metal oxide will comprise aluminum oxide.

The depicted FIGS. 14 and 15 processing is with respect to substrate 10 of FIG. 5. However, processing of any of substrates 10a–10e of FIGS. 6–9 and FIG. 13 can result in the same of similar configuration to that of FIG. 14.

Anodic oxidizing of aluminum and other metals disclosed herein can be conducted with various chemistries and in various manners. An exemplary typical technique comprises positioning the substrate in an acid bath. Metal 24 is tied/connected with some suitable potential and comprises one electrode of a circuit. The bath comprises the other electrode of the circuit. For example and by way of example only, typical acids include oxalic acid, chromic acid, sulfuric acid, phosphorus acid and boric acid, and including combinations of these. Acid concentration is generally at 1% to 20% by weight, and more preferably from 2% to 10% by weight, but as well, can be conducted outside of these ranges. Exemplary preferred voltages are from 10 volts to 120 volts. Preferred anodic oxidizing is preferably carried out at a constant voltage, with a current draw on the substrate being on the order of about 1 to 30 mA/cm$^2$.

The exemplary depicted channels 32, 34, 36 and 38 are depicted as corresponding to the minimum lateral width dimensions of openings 27, 28, 29 and 30 in masking layer 26, although such may not exactly so coincide at this point or subsequently in the process. For example, the size of the depicted channels 32, 34, 36 and 38 might be narrower than openings 27, 28, 29 and 30 at least as initially formed. Further if so, such might be widened after the anodic oxidizing using a suitable etch chemistry, for example 3% to 10% by weight phosphoric acid (5% being a specific example) for isotropically etching and widening the channels when such are formed in aluminum oxide formed by the anodic oxidizing of aluminum. Accordingly under such circumstances and regardless, channels 32, 34, 36 and 38 might be narrower than, wider than, or equal to the depicted cross section of openings 27, 28, 29 and 30 in masking layer 26. Anodic oxidizing may form channels 32, 34, 36, and 38 in material 40 as propagated by etching through the configuration of openings 27, 28, 29 and 30 into any of various cross sections.

The size of channels 32, 34, 36 and 38 can be controlled as determined by the artisan by selection of the anodizing acid, as well as the applied voltage and current. For a given acid, higher voltages, and thereby greater current densities, tend to produce wider channels, with an exemplary preferred range being from 0.5 to 1.4 nanometers/Volt depending on the acid and concentration. An exemplary preferred current density range is from 0.5 to 100 milliamps/cm$^2$. With respect to the type of acid used, larger to smaller cell sizes tend in an apparent ordering of sulfuric acid, oxalic acid, chromic acid and phosphoric acid. Further, the applied voltage, applied current, and acid can impact spacing between the individual channels. For example, spacing between pores as a function of applied voltage tends to be from 2.0 to 4.0 nanometers/Volt, with 2.5 nanometers/Volt being an average. Generally, pore spacing can be impacted greatest by applied voltage, while pore size/width can be impacted greatest by type of acid utilized. Acid type, applied voltage, and applied current can be selected/optimized such that spacing between the openings is essentially determined by pit spacing as created by any of the above or other techniques.

Preferred and other exemplary aspects of anodic oxidizing, for example using aluminum, are disclosed in the following articles, which are provided as exemplary processing techniques for anodic oxidizing, for example which might be utilized in accordance with the invention: Songsheng Tan et al., *High Aspect Ratio Microstructures on Porous Anodic Aluminum Oxide*, IEEE, pp. 267–272 (1995); Ahmed Nadeem et al., *Fabrication of Microstructures Using Aluminum Anodization Techniques*, pp. 274–277; C. Y. Liu et al., *Ordered anodic alumina nanochannels on focused-ion-beam-prepatterned aluminum surfaces*, Appl. Phys. Lett., Vol. 78, No. 1, pp. 120–122 (Jan. 1, 2001); Shoso Shingubara, *Fabrication of nanomaterials using porous alumina templates*, Journal of Nanoparticle Research, Vol. 5, pp. 17–30 (2003); and Hideki Masuda et al., *Highly ordered nanochannel-array architecture in anodic alumina*, Appl. Phys. Lett., Vol. 71, No. 19, pp. 2770–2772 (Nov. 10, 1997).

Figure 16:
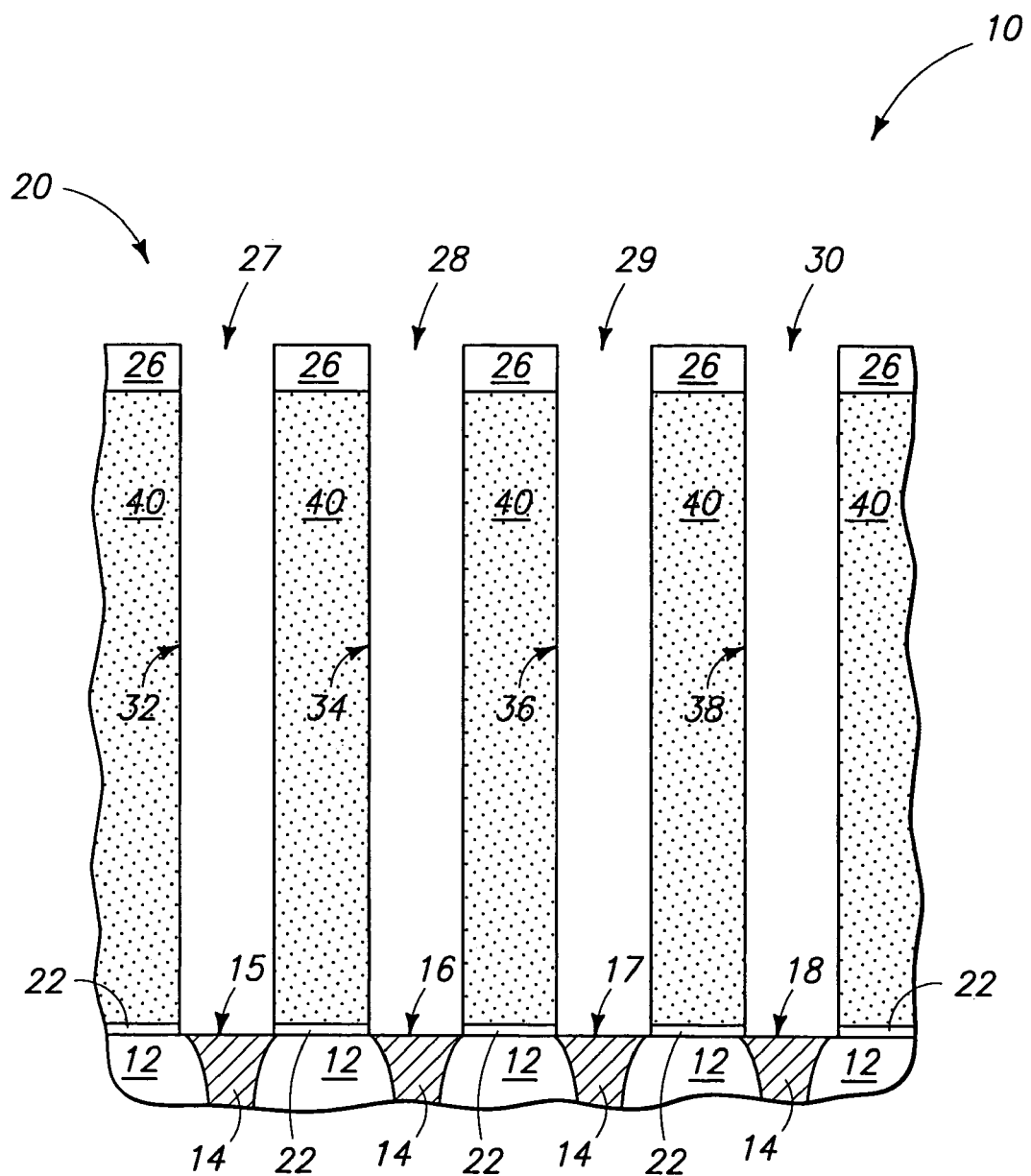
FIG. 16 is a view of the FIG. 14 substrate at a processing step subsequent to that shown by FIG. 14.

Referring to FIG. 16, and where for example the anodic oxidizing did not form the channels to extend to and expose the individual capacitor storage node locations, material 22 has been etched from over individual capacitor storage node locations 15, 16, 17 and 18.

Referring to FIG. 17, an electrically conductive layer 46 has been deposited over patterned masking layer 26 and to within channels 32, 34, 36 and 38 effective to line such channels with such layer. Such might be deposited by any of physical vapor deposition, chemical vapor deposition, atomic layer deposition, and/or any other method, and whether existing or yet-to-be developed. An exemplary material comprises titanium nitride.

Figure 18:
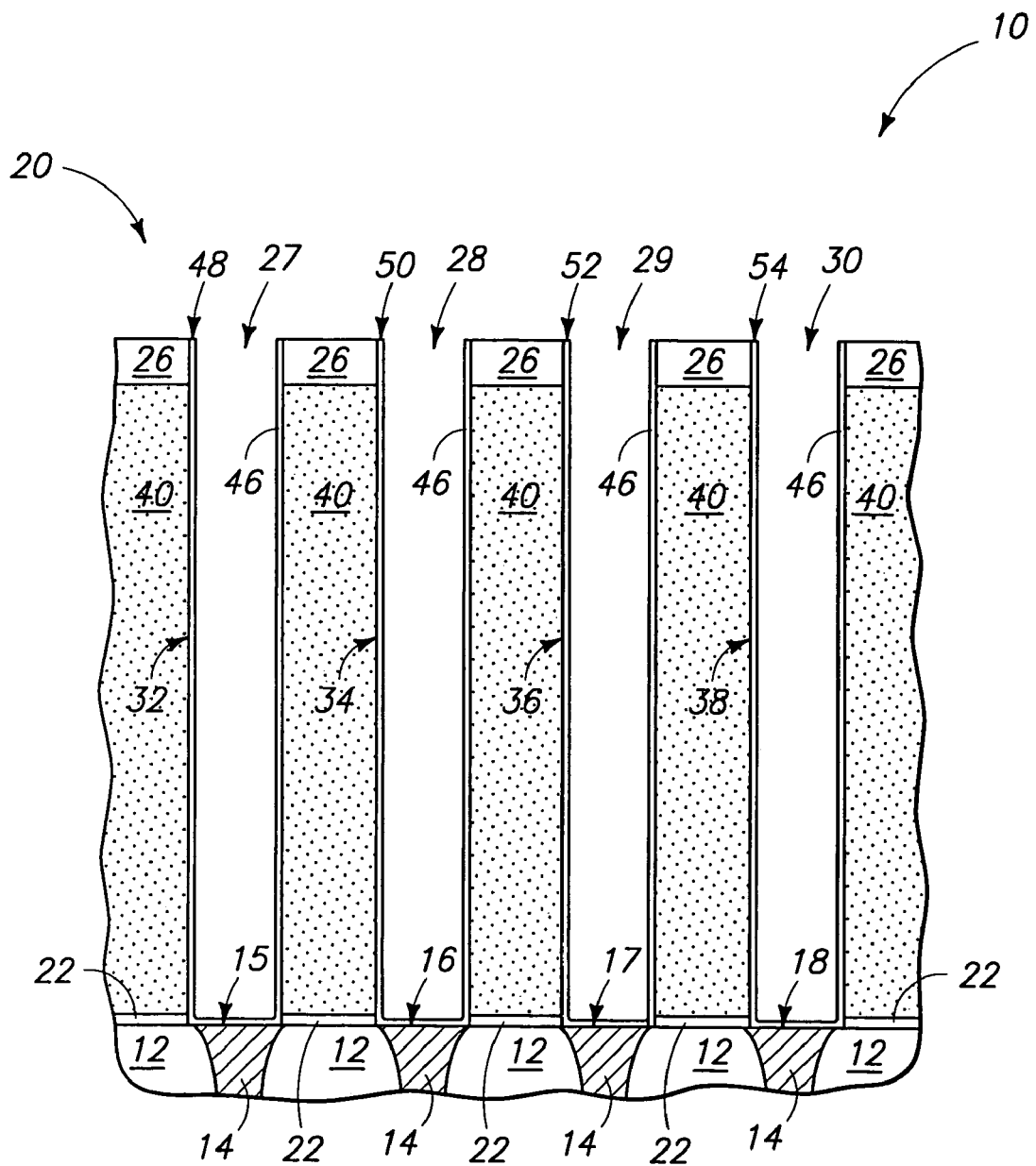
FIG. 18 is a view of the FIG. 17 substrate at a processing step subsequent to that shown by FIG. 17.

Referring to FIG. 18, electrically conductive layer 46 has been removed back at least to patterned masking layer 26, preferably and for example by polishing (such as chemical mechanical polishing) effective to form individual container-shaped capacitor electrodes 48, 50, 52 and 54 within channels 32, 34, 36 and 38, respectively, in electrical connection with individual capacitor storage node locations 15, 16, 17 and 18, respectively. Such provides but one exemplary method of at least partially filling the channels with electrically conductive capacitor electrode material which is provided in electrical connection with the individual capacitor storage node locations. The preferred and depicted individual capacitor electrodes have one or more individual container shapes, although any other shape is contemplated. For example and by way of example only, channels 32, 34, 36 and 38 might be completely filled with electrically conductive capacitor electrode material, thereby forming solid pillars or other shapes.

In the depicted FIGS. 1–18 embodiments, patterned masking layer 26 might still, subsequent to the FIG. 6 processing, mask an entirety of underlying material 24/40 but for openings formed through masking layer 26 within which the individual capacitor electrodes are formed. Further and regardless, certain aspects of the invention contemplate removal of at least some of the metal oxide from the substrate prior to the formation of capacitor dielectric and outer capacitor electrode materials, for example in maximizing capacitor area.

Figure 19:
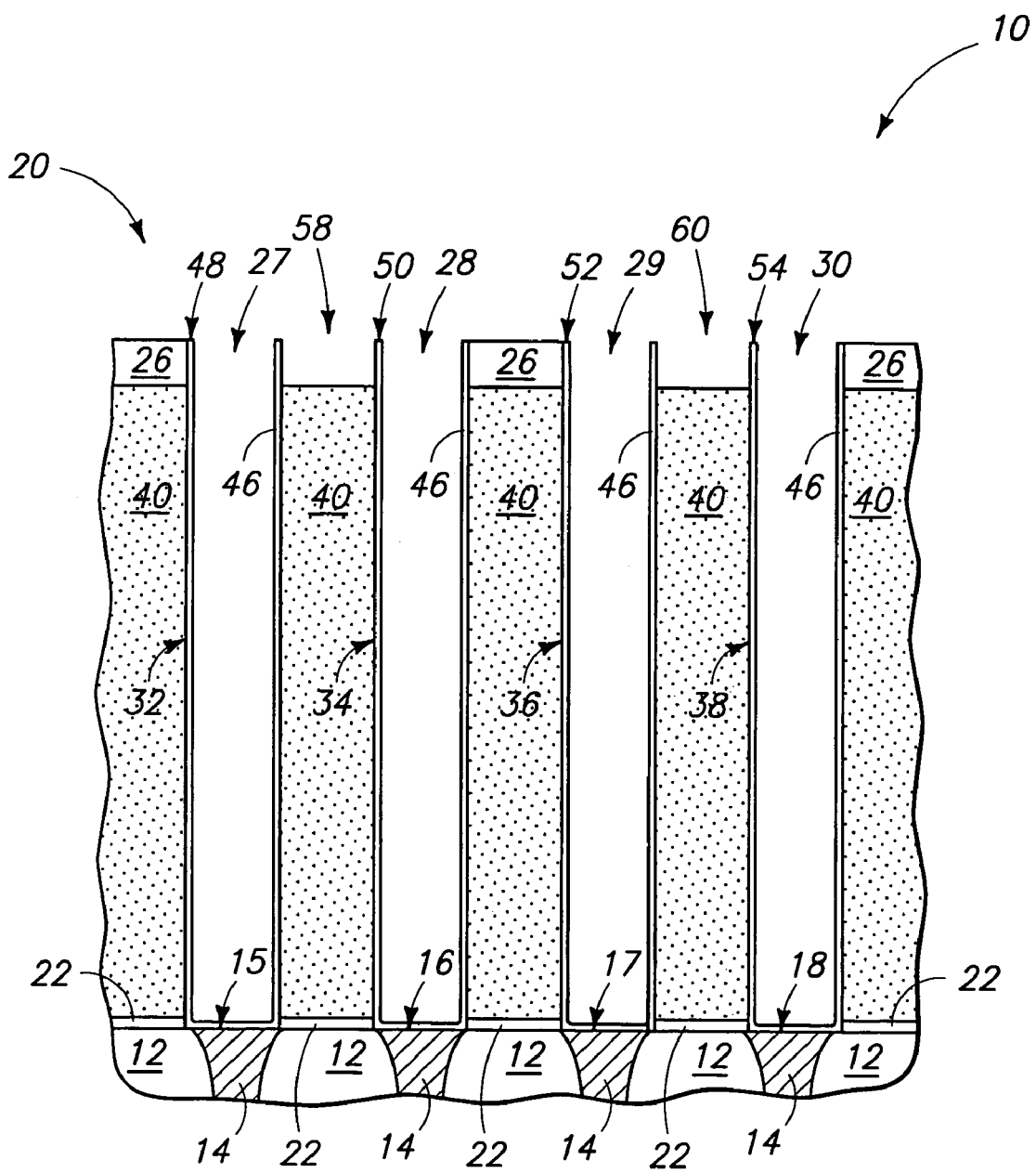
FIG. 19 is a view of the FIG. 18 substrate at a processing step subsequent to that shown by FIG. 18.
Figure 20:
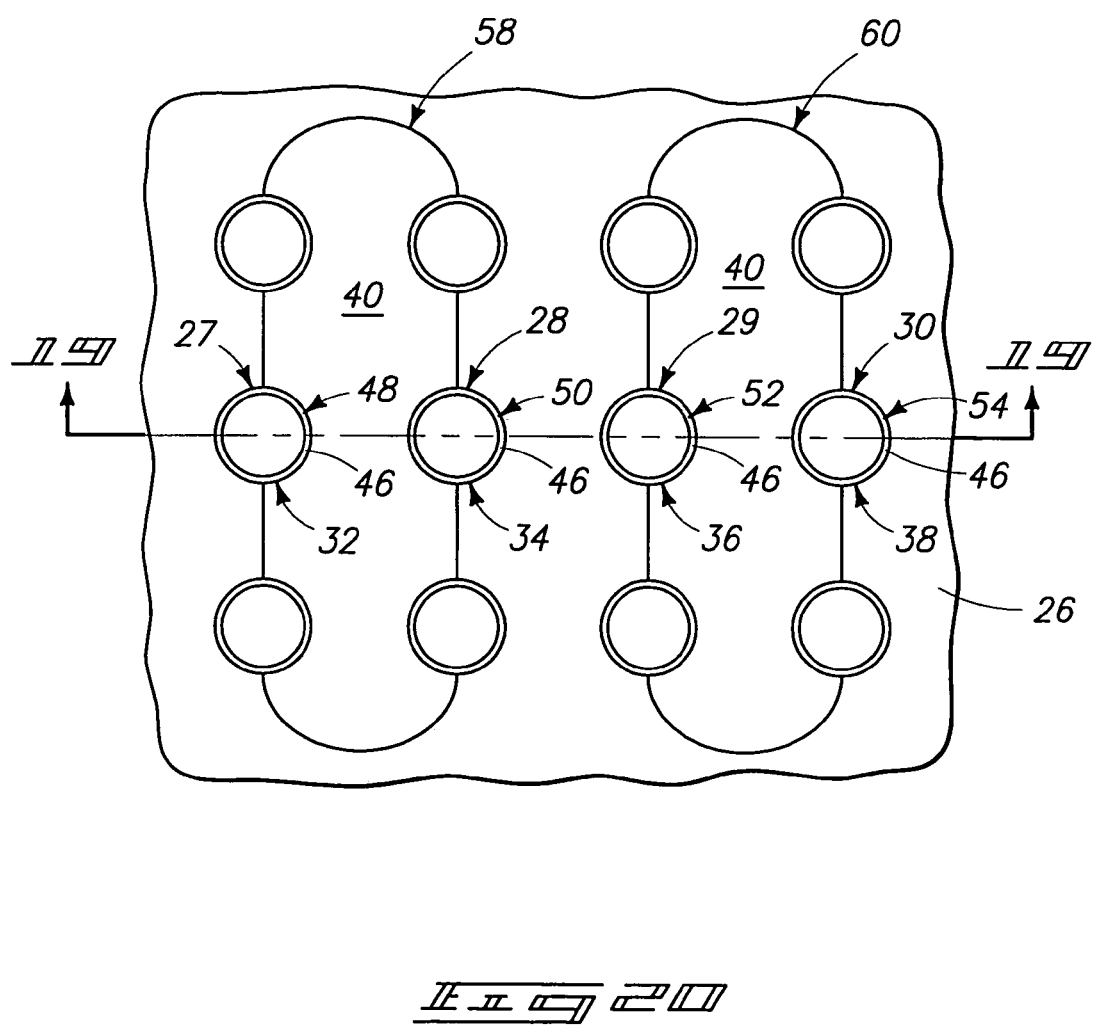
FIG. 20 is a diagrammatic top plan view of the FIG. 19 substrate.

For example and by way of example only, FIGS. 19 and 20 depict the formation of access openings 58 and 60 within masking layer 26 to metal oxide 40. A preferred manner of forming the same, where such are formed, is by lithographic patterning and etch. Such also provides an example of removing at least some of masking layer 26 from substrate 10 after forming individual capacitor electrodes 48, 50, 52 and 54. In some implementations, at least some of the material of patterned masking layer 26 remains as part of finished circuitry construction incorporating the plurality of capacitors being fabricated. In other exemplary embodiments, patterned masking layer 26 might not constitute any part of the finished circuitry construction, and thereby, might be entirely sacrificial such that all of it is removed at the substrate at some point, for example and by way of example only, after the fabrication of individual capacitor electrodes 48, 50, 52 and 54. Again, alternately where such masking layer remains as part of the finished circuitry construction, which is preferred and as described, removal might be of only some of masking layer 26, for example as is depicted in the exemplary embodiment of FIGS. 19 and 20.

Figure 21:
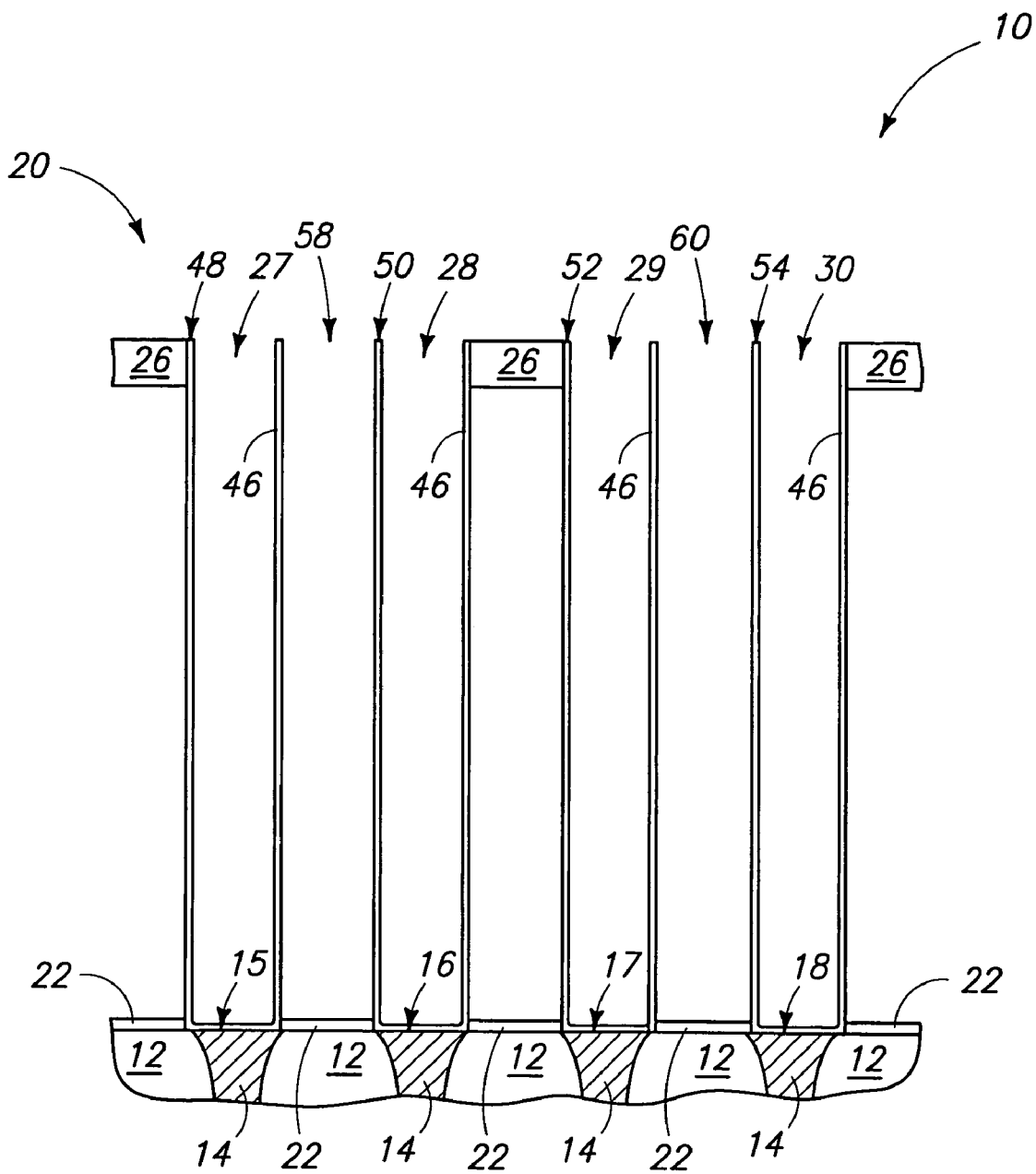
FIG. 21 is a view of the FIG. 19 substrate at a processing step subsequent to that shown by FIG. 19.

Referring to FIG. 21, at least some of metal oxide 40 has been removed from substrate 10. Preferably, such metal oxide is removed by etching through access openings 58 and 60. Only some, or all, of metal oxide material 40 might be removed, with all of such metal oxide depicted as having been etched away in FIG. 21, thereby preferably maximizing the exposure of outer sidewalls of individual capacitor electrodes 48, 50, 52 and 54. An exemplary etching technique, for example where material 46 is titanium nitride and material 40 is aluminum oxide, is a dilute HF wet chemistry, for example 200:1 by weight of a 49% by weight HF solution in water to water, at 70° C., and preferably in a low or no-oxygen ambient. Additional and/or alternate exemplary chemistries include $H_2O_2$, phosphoric acid, and/or mercury chloride.

Figure 22:
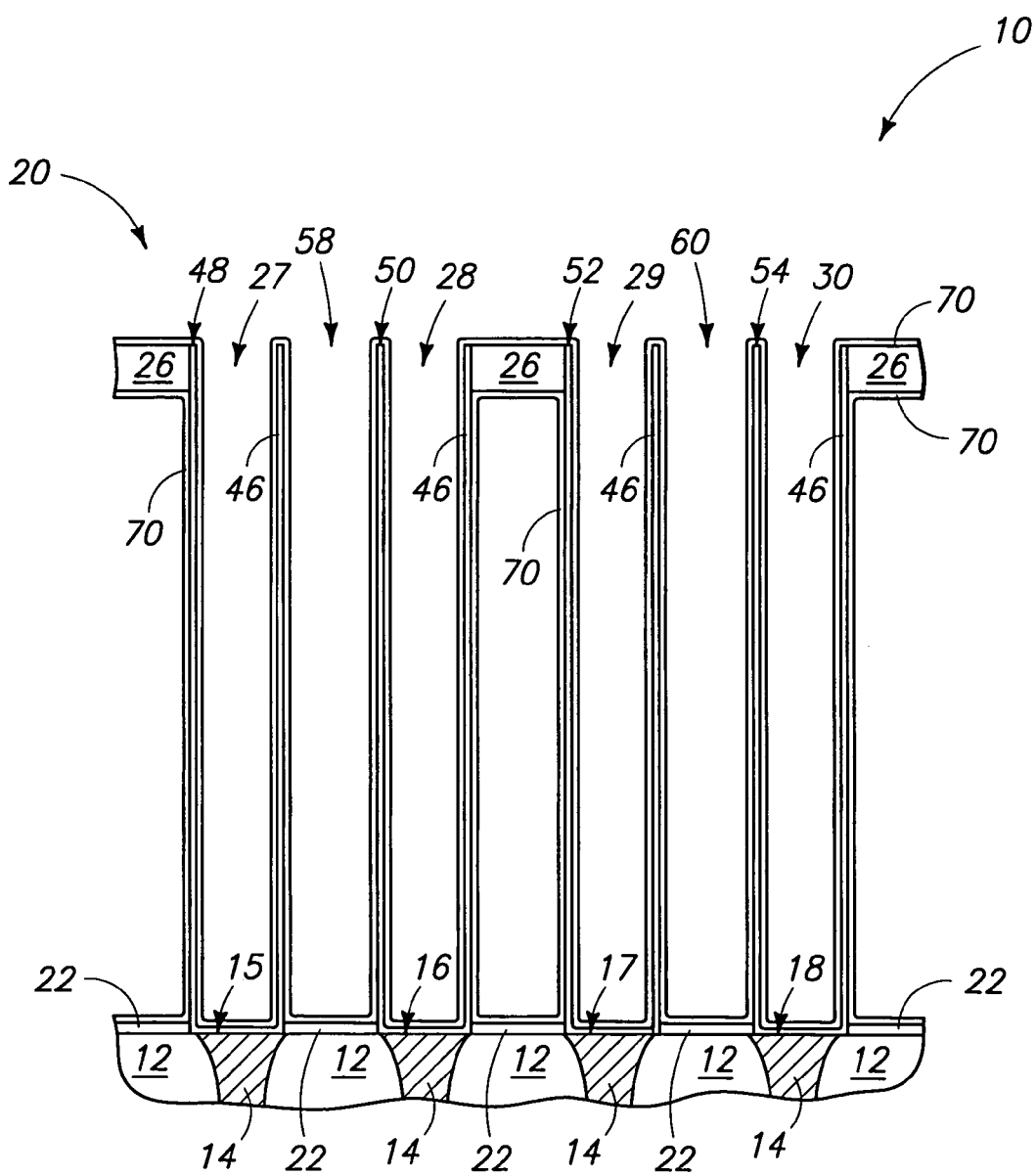
FIG. 22 is a view of the FIG. 21 substrate at a processing step subsequent to that shown by FIG. 21.

Regardless, capacitor electrode material 46 is ultimately incorporated into a plurality of capacitors. For example, FIG. 22 depicts the deposition of a capacitor dielectric layer 70 over patterned masking layer 26 and over the preferred embodiment container-shaped electrodes 48, 50, 52 and 54. By way of example only, an exemplary preferred material is a silicon dioxide, silicon nitride, silicon dioxide composite, or any suitable high k dielectric, whether existing or yet-to-be developed. By way of example only, exemplary high k dielectrics include $Ta_2O_5$ and barium strontium titanate. Capacitor dielectric layer 70 might be commonly deposited as a single layer over each of the inner capacitor electrodes (shown and preferred) or might be separately provided with respect to individual capacitor electrodes.

Figure 23:
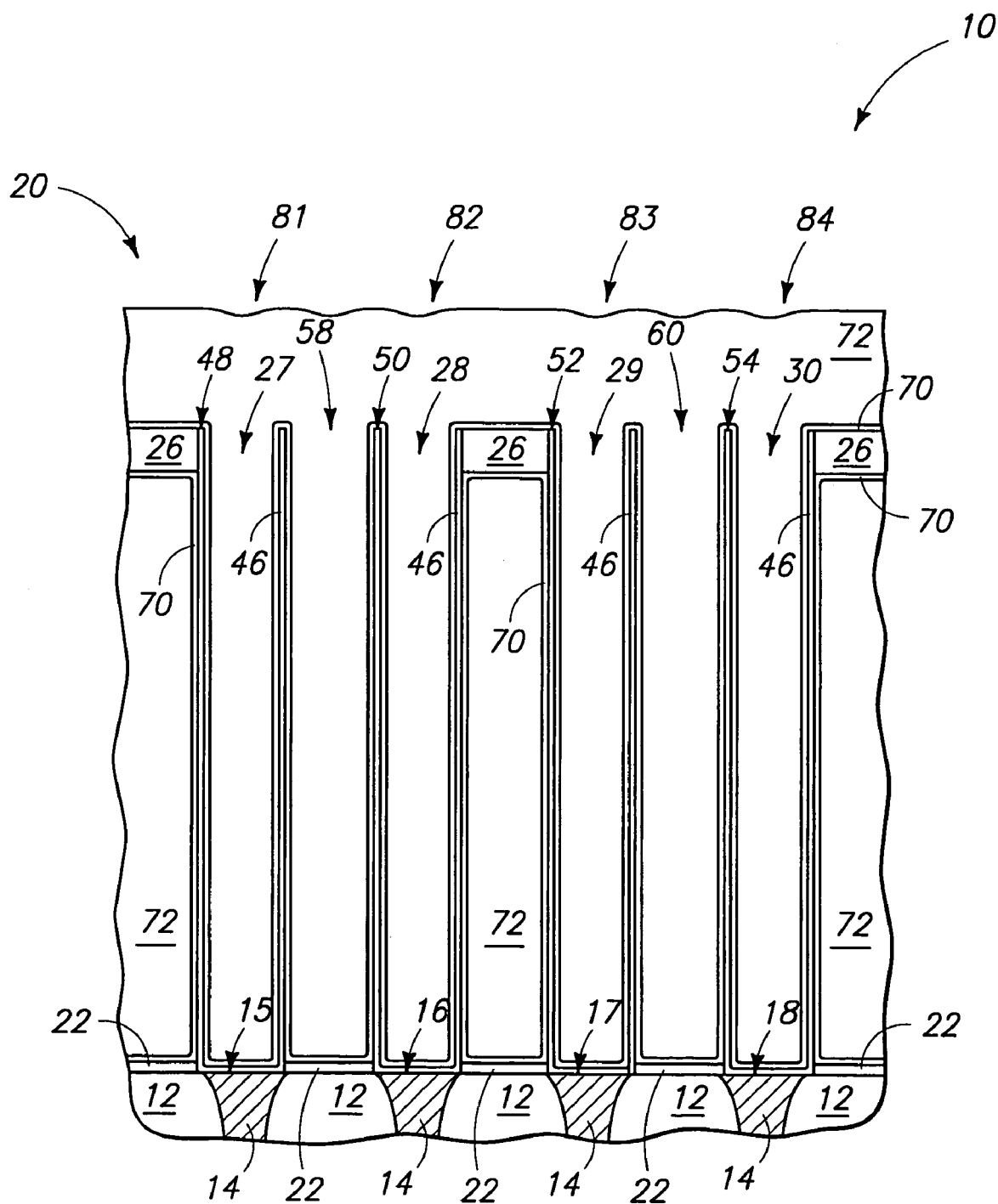
FIG. 23 is a view of the FIG. 22 substrate at a processing step subsequent to that shown by FIG. 22.
Figure 26:
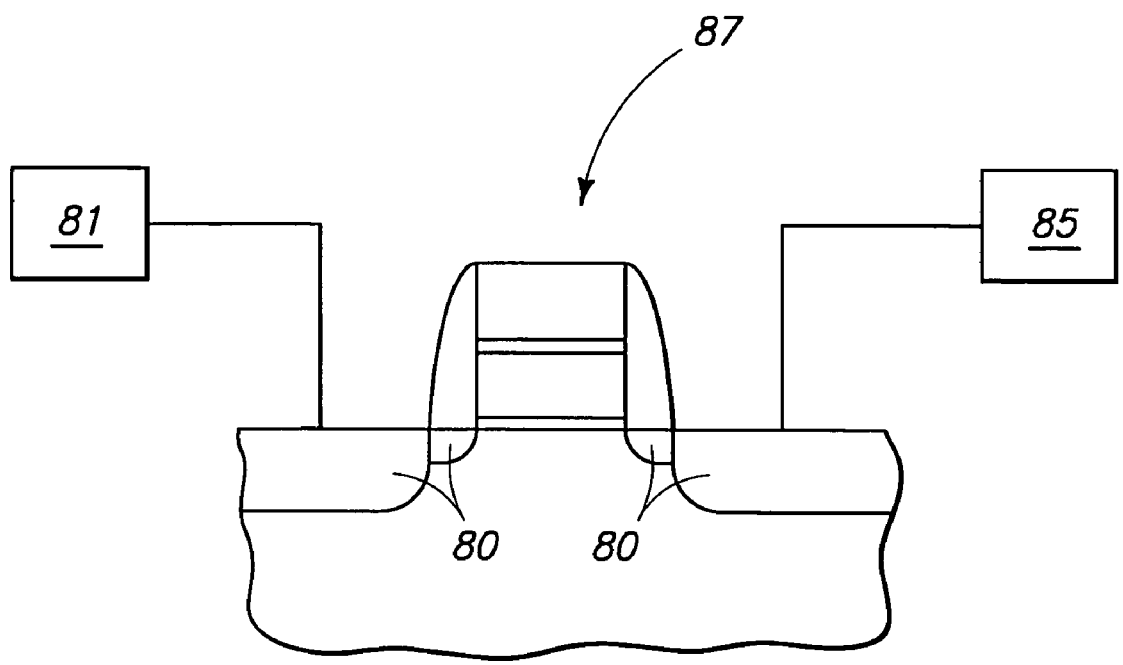
FIG. 26 is a diagrammatic representation of DRAM circuitry.

Referring to FIG. 23, an outer capacitor electrode layer 72 has been deposited over capacitor dielectric layer 70, thereby defining capacitors 81, 82, 83 and 84. Such are depicted as comprising a common cell capacitor plate to all of the depicted capacitors, for example as might be utilized in DRAM or other circuitry. For example and by way of example only, FIG. 26 depicts an exemplary DRAM cell incorporating capacitor 81. Such comprises an exemplary transistor gate word line 87 having insulative sidewall spacers, an insulative cap, a conductive region under the cap such as a silicide, a conductive polysilicon region under the silicide and a gate dielectric region under the polysilicon. Source/drain diffusion regions 80 are shown formed within semiconductive material operatively proximate word line 87. One of such electrically connects with capacitor 81, and another such electrically connects with a bit line 85. Of course alternately with respect to FIG. 23, separate outer capacitor electrodes might be configured with respect to each individual inner capacitor electrode or groups of individual capacitor electrodes.

Figure 24:
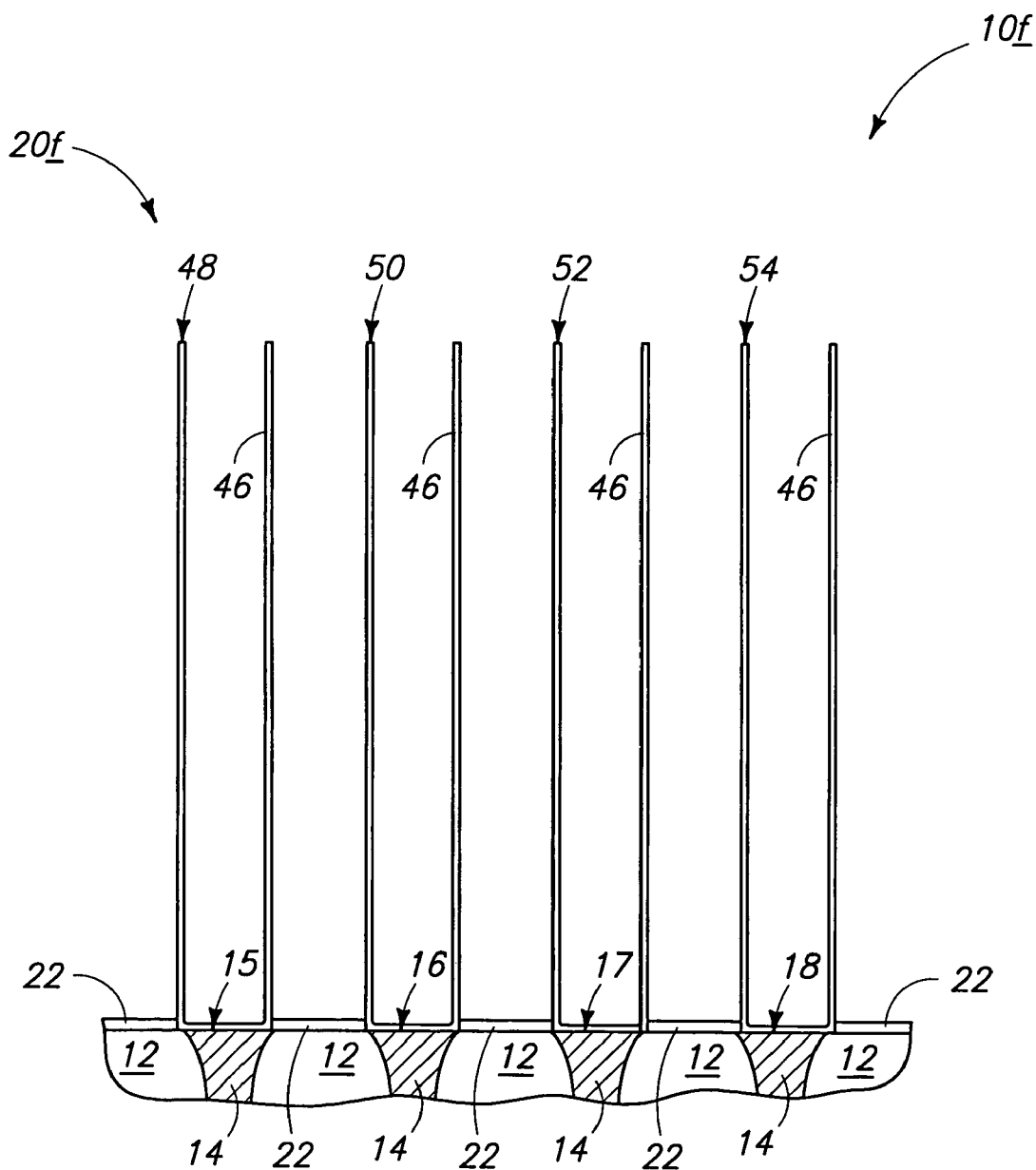
FIG. 24 is a diagrammatic cross section of an alternate substrate fragment in process in accordance with an aspect of the invention.
Figure 25:
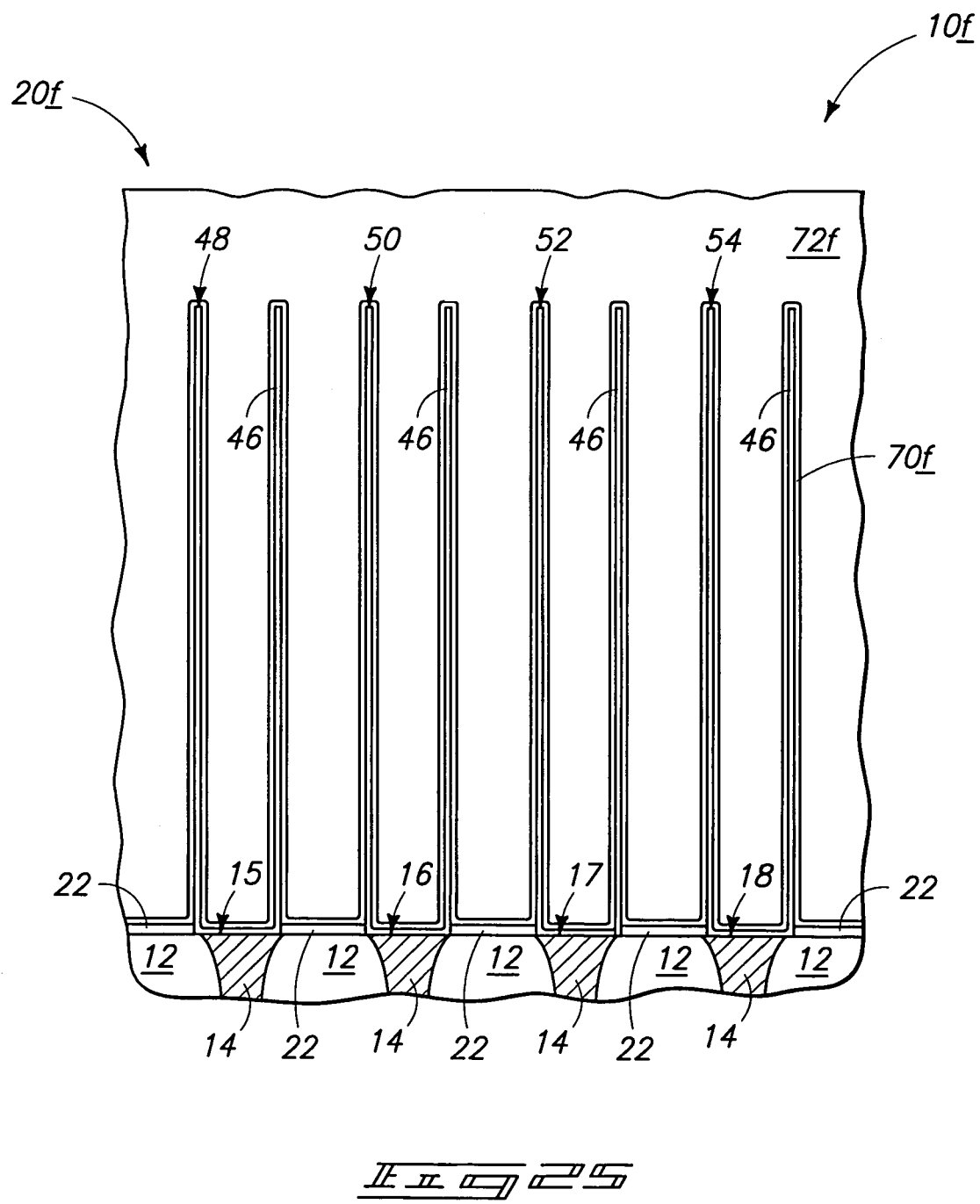
FIG. 25 is a view of the FIG. 24 substrate at a processing step subsequent to that shown by FIG. 24.

The above-described embodiments depict at least some of masking layer 26 remaining as part of the finished circuitry construction. By way of example only with respect to a substrate 10a, an alternate exemplary embodiment is depicted in FIGS. 24 and 25 whereby all of patterned masking layer 26 (not shown) is ultimately removed from the substrate. Like numerals from the first-described embodiment have been utilized where appropriate, with differences being indicated with the suffix "f". FIG. 24 depicts exemplary preferred processing as might occur subsequent to the FIG. 18 depiction. For example, FIG. 24 depicts the removal of all of masking layer 26 (not shown), followed by the removal of at least some, and all as shown, of metal oxide 40 (not shown). FIG. 25 depicts the subsequent deposition of capacitor dielectric layer 70f, and an outer capacitor electrode layer 72f.

An aspect of the invention also contemplates methods of forming a plurality of capacitors independent of whether the above-described patterning masking layer is formed over metal. In such implementation, metal is formed over individual capacitor storage node locations on a substrate, for example metal 24, as shown in FIG. 1. Such metal is contacted with an imprint template effective to form a plurality of pits within an outer surface of the metal, for example as is depicted in FIG. 5, but independent of whether masking layer 26 has been previously formed. Exemplary desired pits are otherwise as described above, and subsequent processing also preferably occurs in any of the above-described, preferred implementations.

An aspect of the invention also contemplates methods of forming a plurality of capacitors independent of whether pits or recessing of the metal occurs prior to the anodic oxidizing. In such implementation, a method of forming a plurality of capacitors includes forming metal over individual capacitor storage node locations on a substrate. A patterned masking layer is formed over the metal, and comprises openings therethrough to an outer surface of the metal. Individual of the openings are received over individual of the capacitor storage node locations. After forming the patterned masking layer, metal is removed from the metal outer surface effective to leave an exposed outer metal surface within the individual openings. The removing of metal might be to a depth of less than 30 Angstroms from said outer metal surface over which the masking layer is received, and to a depth of less than 20 Angstroms from said outer metal surface. Alternately, such removing could be to greater depths. Further, such metal removing might be uniform across individual of the openings, and might be from metal material pillars such that a recessing of metal relative to adjacent metal surfaces does not necessarily occur. Preferred techniques are otherwise as described above.

After such removing of metal, the metal is anodically oxidized through the openings effective to form a single metal oxide-lined channel in individual of the openings over the individual capacitor storage nodes. Individual capacitor electrodes are formed within the channels in electrical connection with the individual capacitor storage node locations. At least some of the metal oxide is removed from the substrate, and the individual capacitor electrodes are incorporated into a plurality of capacitors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
   forming metal over individual capacitor storage node locations on a substrate;
   forming a patterned masking layer over the metal, the patterned masking layer comprising openings therethrough to an outer surface of the metal, individual of the openings being received over individual of the capacitor storage node locations;
   forming a pit in the metal outer surface within individual of the openings;
   after the forming of a pit in the metal outer surface within individual of the openings, anodically oxidizing the metal through the openings effective to form a single metal oxide-lined channel in individual of the openings over the individual capacitor storage nodes;
   forming individual capacitor electrodes within individual of the channels in electrical connection with the individual capacitor storage node locations; and
   removing at least some of the metal oxide from the metal oxide-lined channels and incorporating the individual capacitor electrodes into a plurality of capacitors.

2. The method of claim 1 wherein forming the pit comprises etching the metal.

3. The method of claim 1 wherein forming the pit comprises mechanical imprinting of the metal.

4. The method of claim 1 wherein the pit has a depth of at least 20 Angstroms in the metal.

5. The method of claim 1 wherein the pit has a depth of at least 30 Angstroms in the metal.

6. The method of claim 1 wherein the pit is "v" shaped.

7. The method of claim 6 wherein the "v" shaped pit has straight sidewalls.

8. The method of claim 6 wherein the "v" shaped pit has convexly curved sidewalls.

9. The method of claim 6 wherein the pit has a depth of at least 20 Angstroms in the metal.

10. The method of claim 6 wherein the pit has a depth of at least 30 Angstroms in the metal.

11. The method of claim 1 wherein the pit is "u" shaped.

12. The method of claim 1 comprising forming no more than a single pit per individual opening.

13. The method of claim 12 wherein the pit has a depth of at least 20 Angstroms in the metal.

14. The method of claim 12 wherein the pit has a depth of at least 30 Angstroms in the metal.

15. The method of claim 12 wherein the pit is centered between sidewalls defining the individual openings in the patterned masking layer.

16. The method of claim 12 wherein the pit spans entirely between sidewalls defining the individual openings in the patterned masking layer.

17. The method of claim 16 wherein the pit is "v" shaped.

18. The method of claim 17 wherein the "v" shaped pit has straight sidewalls.

19. The method of claim 17 wherein the "v" shaped pit has convexly curved sidewalls.

20. The method of claim 16 wherein the pit is "u" shaped.

21. The method of claim 1 wherein the metal comprises aluminum, and the metal oxide comprises aluminum oxide.

22. The method of claim 1 wherein the metal comprises at least one of Ti, Ta, Nb, Zr, W, V, Hf, Si, B, and Bi.

23. The method of claim 1 wherein forming the patterned masking layer comprises lithography and etch.

24. The method of claim 1 wherein the patterned masking layer is electrically insulative.

25. The method of claim 24 wherein at least some material of the patterned masking layer remains as part of finished circuitry construction incorporating the plurality of capacitors, said incorporating comprising depositing a capacitor dielectric layer and an outer capacitor electrode layer over said material of the patterned masking layer.

26. The method of claim 1 comprising after the anodically oxidizing, removing at least some of the patterned masking layer from the substrate.

27. The method of claim 26 wherein said removing of at least some of the patterned masking layer is of only some of the patterned masking layer.

28. The method of claim 26 wherein said removing of at least some of the patterned masking layer occurs after forming the individual capacitor electrodes.

29. The method of claim 28 wherein said removing of at least some of the patterned masking layer is of only some of the patterned masking layer.

30. The method of claim 26 wherein said removing of at least some of the patterned masking layer is of all of the patterned masking layer.

31. The method of claim 1 wherein forming the individual capacitor electrodes comprises deposition of an electrically conductive layer and polishing said conductive layer back at least to the patterned masking layer.

32. The method of claim 1 wherein the anodically oxidizing forms the channels to extend to and expose the individual capacitor storage node locations.

33. The method of claim 1 wherein the anodically oxidizing does not form the channels to extend to and expose the individual capacitor storage node locations, and wherein forming the individual capacitor electrodes comprises depositing an electrically conductive layer; and etching material from over the individual capacitor storage node locations prior to depositing said conductive layer.

34. The method of claim 1 wherein the anodically oxidizing oxidizes all said metal to metal oxide.

35. The method of claim 1 wherein individual of the capacitor electrodes comprises a container shape.

36. The method of claim 1 wherein said removing is of all said metal oxide.

37. The method of claim 1 wherein said removing is of only some of said metal oxide.

38. A method of forming a plurality of capacitors, comprising:
forming metal over individual capacitor storage node locations on a substrate;
forming a patterned masking layer over the metal, the patterned masking layer comprising openings therethrough to an outer surface of the metal, individual of the openings being received over individual of the capacitor storage node locations;
forming anisotropically etched sidewall spacers over opposing sidewalls of the individual masking layer openings;
recessing the metal within the individual openings intermediate the sidewall spacers;
after the recessing, removing the sidewall spacers;
after removing the sidewall spacers, anodically oxidizing the metal through the openings effective to form a single metal oxide-lined channel in individual of the openings over the individual capacitor storage nodes;
forming individual capacitor electrodes within individual of the channels in electrical connection with the individual capacitor storage node locations; and
removing at least some of the metal oxide from the metal oxide-lined channels and incorporating the individual capacitor electrodes into a plurality of capacitors.

39. A method of forming a plurality of capacitors, comprising:
forming metal over individual capacitor storage node locations on a substrate;
forming a patterned masking layer over the metal, the patterned masking layer comprising openings therethrough to an outer surface of the metal, individual of the openings being received over individual of the capacitor storage node locations;
after forming the patterned masking layer, removing metal from the metal outer surface effective to leave an exposed outer metal surface within the individual openings;
after said removing of metal, anodically oxidizing the metal through the openings effective to form a single metal oxide-lined channel in individual of the openings over the individual capacitor storage nodes;
forming individual capacitor electrodes within individual of the channels in electrical connection with the individual capacitor storage node locations; and
removing at least some of the metal oxide from the metal oxide-lined channels and incorporating the individual capacitor electrodes into a plurality of capacitors.

40. The method of claim 39 wherein said removing of metal is to a depth of less than 30 Angstroms from said outer metal surface over which the masking layer is received.

41. The method of claim 40 wherein said removing of metal is to a depth of less than 20 Angstroms from said outer metal surface over which the masking layer is received.

42. The method of claim 39 wherein said removing of metal is uniform across individual of the openings.

43. The method of claim 39 comprising prior to said removing of metal, forming anisotropically etched sidewall spacers over opposing sidewalls of the individual masking layer openings;
recessing the metal within the individual openings intermediate the sidewall spacers;
after the recessing, removing the sidewall spacers;
after removing the sidewall spacers, conducting said anodically oxidizing.

44. A method of forming a plurality of capacitors, comprising:
forming metal over individual capacitor storage node locations on a substrate;
contacting the metal with an imprint template effective to form a plurality of pits within an outer surface of the metal, individual of the pits being received over individual of the capacitor storage node locations;
after forming the pits, anodically oxidizing the metal from within the pits effective to form a single metal oxide-lined channel to individual of the capacitor storage nodes;
forming individual capacitor electrodes within individual of the channels in electrical connection with the individual capacitor storage node locations; and
removing at least some of the metal oxide from the metal oxide-lined channels and incorporating the individual capacitor electrodes into a plurality of capacitors.

* * * * *